(12) United States Patent
Hirano et al.

(10) Patent No.: US 7,910,403 B2
(45) Date of Patent: Mar. 22, 2011

(54) METAL PARTICLES-DISPERSED COMPOSITION AND FLIP CHIP MOUNTING PROCESS AND BUMP-FORMING PROCESS USING THE SAME

(75) Inventors: Koichi Hirano, Osaka (JP); Seiji Karashima, Osaka (JP); Takashi Ichiryu, Osaka (JP); Yoshihiro Tomita, Osaka (JP)

(73) Assignee: Panasonic Corporation, Osaka (JP)

( * ) Notice: Subject to any disclaimer, the term of this patent is extended or adjusted under 35 U.S.C. 154(b) by 676 days.

(21) Appl. No.: 11/885,562

(22) PCT Filed: Mar. 6, 2006

(86) PCT No.: PCT/JP2006/304256
§ 371 (c)(1),
(2), (4) Date: Dec. 13, 2007

(87) PCT Pub. No.: WO2006/095677
PCT Pub. Date: Sep. 14, 2006

(65) Prior Publication Data
US 2008/0142966 A1 Jun. 19, 2008

(30) Foreign Application Priority Data
Mar. 9, 2005 (JP) ................................. 2005-065243

(51) Int. Cl.
*H01L 21/00* (2006.01)
(52) U.S. Cl. ................. 438/108; 257/737; 257/E21.506; 438/613; 438/614
(58) Field of Classification Search .................... 438/108
See application file for complete search history.

(56) References Cited

U.S. PATENT DOCUMENTS

| 5,145,532 | A | | 9/1992 | Fukunaga et al. |
| 5,994,152 | A | * | 11/1999 | Khandros et al. ............. 438/617 |
| 2001/0008310 | A1 | | 7/2001 | Sakuyama et al. |
| 2001/0019075 | A1 | | 9/2001 | Abe et al. |
| 2007/0001313 | A1 | * | 1/2007 | Fujimoto et al. .............. 257/778 |

FOREIGN PATENT DOCUMENTS

EP 1 615 263 1/2006
(Continued)

OTHER PUBLICATIONS

"*Electronics Packaging Technology*", Sep. 2000, pp. 38-45.
(Continued)

*Primary Examiner* — Ajay K Arora
(74) *Attorney, Agent, or Firm* — Wenderoth, Lind & Ponack, L.L.P.

(57) ABSTRACT

A flip chip mounting process wherein a semiconductor chip and a circuit substrate are electrically interconnected. The process includes the steps of preparing a semiconductor chip on which a first plurality of electrodes are formed and a circuit substrate on which a second plurality of electrodes are formed; supplying a composition onto a surface of the circuit substrate, such surface being provided with second plurality of electrodes; bringing the semiconductor chip into contact with a surface of said composition such that the first plurality of electrodes are opposed to the second plurality of electrodes; and heating the circuit substrate, and thereby electrical connections including a metal component constituting the metal particles dispersed in the composition are formed between the first plurality of electrodes and the second plurality of electrodes. Also, a thermoset resin layer is formed between the semiconductor chip and the circuit substrate.

10 Claims, 14 Drawing Sheets

FOREIGN PATENT DOCUMENTS

| | | |
|---|---|---|
| JP | 01-157796 | 6/1989 |
| JP | 2-36289 | 2/1990 |
| JP | 2-251145 | 10/1990 |
| JP | 6-125169 | 5/1994 |
| JP | 7-74459 | 3/1995 |
| JP | 9-27516 | 1/1997 |
| JP | 11-186334 | 7/1999 |
| JP | 2000-94179 | 4/2000 |
| JP | 2000-332055 | 11/2000 |
| JP | 2001-329048 | 11/2001 |
| JP | 2002-26070 | 1/2002 |
| WO | 2004/070827 | 8/2004 |

OTHER PUBLICATIONS

Masahiro Yasuda et al., "*Self-Organized Joining Assembly Process by Electrically Conductive Adhesive Using Low Melting Point Fillers*", 10th Symposium on "Microjoining and Assembly Tehnology in Electronics", Feb. 5-6, 2004, pp. 183-188.

Masahiro Rito, et al., "*Assembly Process by Electrically Conductive Adhesive Using Low Melting Point Fillers*", 9th Symposium on "Microjoining and Assembly Technology in Electronics", Feb. 6-7, 2003, pp. 115-120.

Yasuhisa Kaga et al. "*Development of Soldering Technique through Super Solder*", Technical Report of IEICE, EMD96-15, Jun. 1996, pp. 23-31.

Kiyokazu Yasuda et al., "*Self-Organized Packaging using Polymer Containing Low-Melting-Point-Metal Filler Process Simulation of Viscous Multi Phase Flow Fluid*", 11th Symposium on "Microjoining and Assembly Technology in Electronics", Feb. 3-4, 2005, pp. 239-244.

Takayuki Yamada, et al., "*Self-organized Packaging by Polymer Containing Low Melting Point Metal Experimental Verification of Process Rule Factors of Self-organization*", 11th Symposium on Microjoining and Assembly Technology in Electronics, Feb. 3-4, 2005, pp. 245-250.

Koushi Ohta et al., "*Study on Self-Organization Assembly Process Based on MARS Method 3-Dimensional 2-Phase Flow Analysis*", 12th Symposium on "Microjoining and Assembly Technology in Electronics", Feb. 3-4, 2006, pp. 381-386.

Masao Toya et al., "*Experimental Verification of Lateral Flow Effects in Resin Containing Solder Fillers on Self-Organization Joining Process*", MES2006 (micro electronics symposium), Oct. 2006, pp. 335-338.

Masaru Yamashita et al., "*Analysis Concerning the Coalescence Behavior of Metal Droplet in Self-organization*", 13th Symposium on "Microjoining and Assembly Technology in Electronics", Feb. 1-2, 2007, pp. 55-60.

Patent Cooperation Treaty (PCT) International Preliminary Report on Patentability, issued Aug. 12, 2008.

* cited by examiner

Fig. 2A
(a)
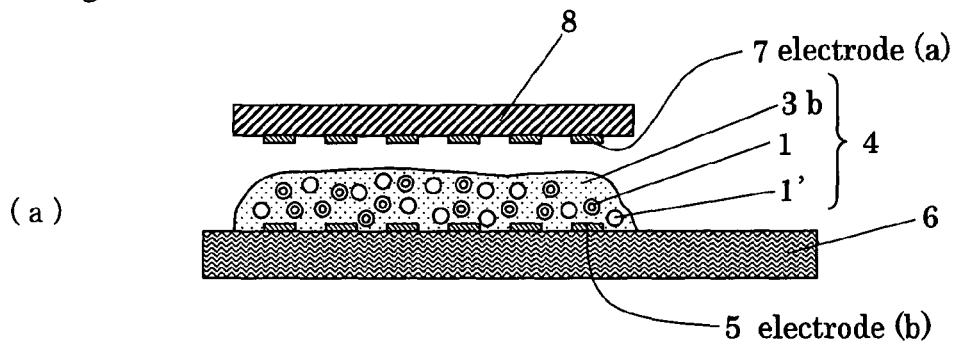
(b)
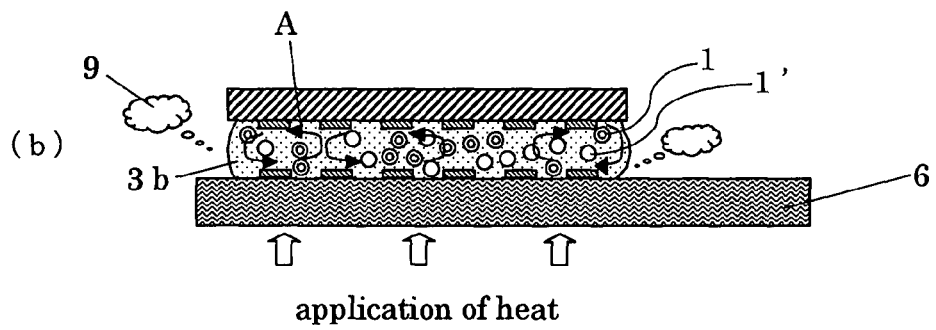
application of heat
(c)
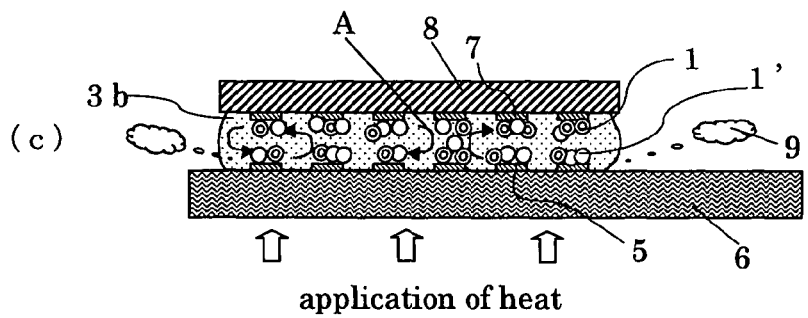
application of heat
(d)
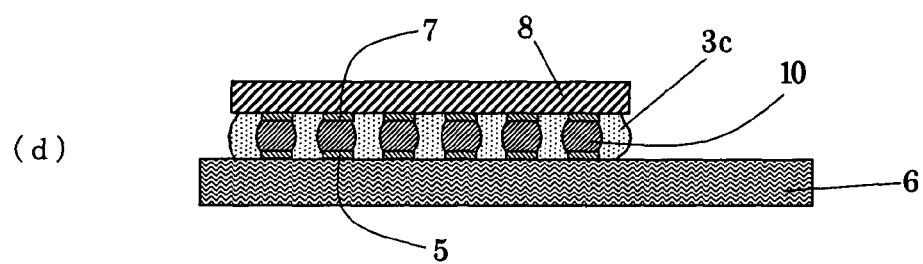

Fig. 2B
(a) 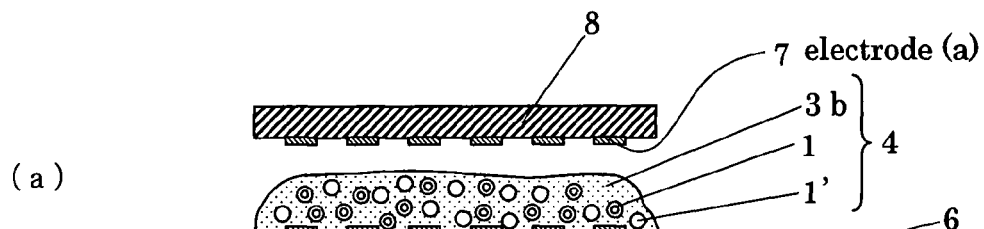
(b) 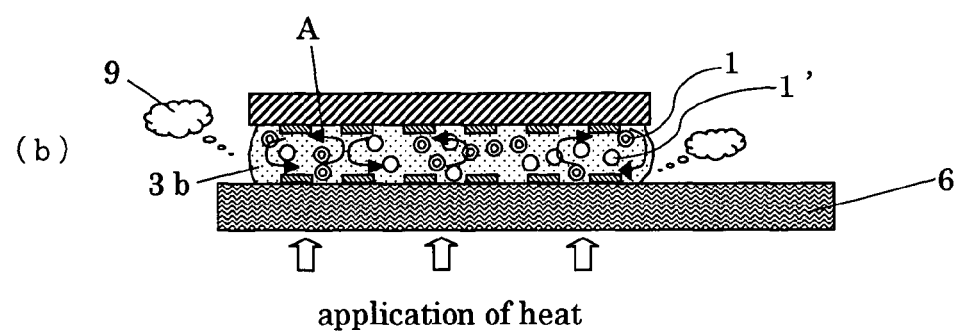
application of heat
(c) 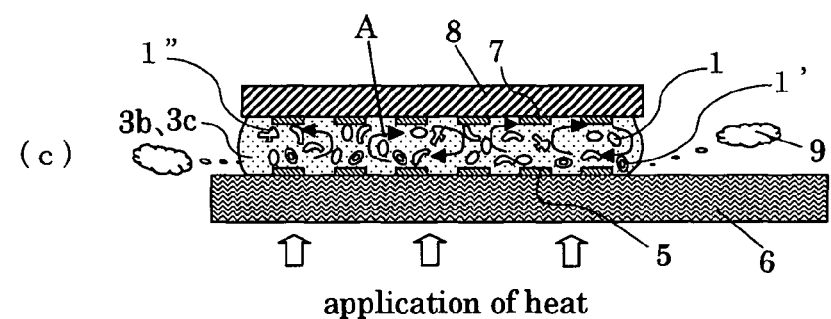
application of heat
(d) 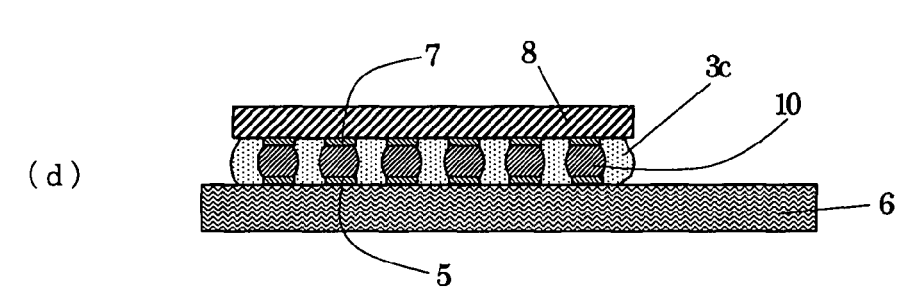

METAL PARTICLES-DISPERSED COMPOSITION AND FLIP CHIP MOUNTING PROCESS AND BUMP-FORMING PROCESS USING THE SAME

BACKGROUND OF THE INVENTION

1. Technical Field

The present invention relates to a composition in which metal particles are dispersed (the composition is hereinafter referred to also as "metal particles-dispersed composition"). In particular, the present invention relates to a metal particles-dispersed composition that is used for electrically interconnecting a circuit substrate and a semiconductor chip, or a metal particles-dispersed composition that is used for forming bumps on electrodes of a circuit substrate. Furthermore, the present invention relates to a flip chip mounting process and a bump-forming process using the metal particles-dispersed composition.

2. Description of the Related Art

In recent years, mobile electronic devices such as a cellar phone, a notebook-size personal computer, PDA and a digital video camera have been increasingly used, and they are becoming smaller, thinner and lighter. There has been also increasing a demand for a high performance and a multifunction of the mobile electronic devices. As a result, electronic components such as a semiconductor device and a circuit component are becoming ultrasmall, and thereby a mounting process or a packaging process of the electronic components has been improved. Also, a high-density process of an electronic circuit has been rapidly improved.

The technology needed for the high-density process of the electronic circuit is a high-density mounting technology or a high-density packaging technology for a semiconductor integrated circuit (LSI). With a rapid development of a high pin-number and a fine pitch for connecting electrodes (which are hereinafter referred to also as "electrode(s)") of a LSI chip, semiconductor packaging technologies such as CSP (chip size package) by performance of the flip chip mounting of a bare chip as well as PPGA and BGA mounting processes for external terminals have been commonly used. Therefore, there is a demand for a new mounting technology or a new packing technology that can accommodate a high-speed processing and a miniaturization of a mounted IC as well as a high number of input/output terminals of the mounted IC.

In a flip chip mounting process, firstly, a plurality of electrode pads are formed on a semiconductor chip. Then, bumps are formed on the electrode pads by using a material such as a solder, Au or the like. Subsequently the semiconductor chip is mounted over a circuit substrate such that the bumps of the semiconductor chip are opposed to a plurality of electrodes formed on the circuit substrate. This results in a formation of an electrical conduction between the bumps and the electrodes. After that, a resin material (underfill agent) is poured into a clearance gap between the semiconductor chip and the circuit substrate so as to form a mechanical connection between the semiconductor chip and the circuit substrate.

For mounting a next-generation LSI having 5000 or more electrodes over a circuit substrate, it is required to form fine-pitch bumps with their pitch of 100 μm or less. It is, however, difficult for a conventional solder bump-forming process to form such fine-pitch bumps.

Moreover, from a viewpoint that a large number of bumps must be formed according to the number of the electrodes, a high productivity is required for reducing a manufacturing cost by reducing mounting tact time per chip.

There has been developed a plating process and a screen printing process as a conventional bump-forming process. The plating process is suitable for achieving a fine pitch, but it is complicated and has to compromise the productivity. The screen printing process, on the other hand, has a high productivity, but is not suitable for achieving the fine pitch since a mask is used.

Recently, there has been proposed several processes for selectively forming solder bumps on electrodes of a LSI chip or a circuit substrate. These processes are not only suitable for achieving a fine pitch of the bumps, but also suitable for achieving a high productivity since a plurality of the fine bumps can be formed in a batch process. Accordingly they are expected as promising processes that can be applicable to a mounting or packaging for the next-generation LSI.

According to one of these promising processes, a solder paste comprising a mixture of solder powder and a flux is applied directly onto a whole surface of a circuit substrate having electrodes (surfaces of the electrodes have been oxidized). Subsequently the circuit substrate is heated so as to melt the solder powder. As a result, solder bumps (solder layers) are selectively formed on the electrodes without causing an electrical short circuit between the adjacent electrodes. See Japanese Patent Kokai Publication No. 2000-94179 (which is referred to also as "Patent literature 1"), for example.

According to another one of the promising processes, a paste composition (so-called "deposition type solder using chemical reaction") mainly comprising organic acid lead salt and tin metal is applied onto a whole surface of a circuit substrate, the surface being provided with electrodes. Subsequently the circuit substrate is heated so as to induce a displacement reaction for Pb and Sn, and thereby Pb/Sn alloy is selectively deposited on the electrodes of the circuit substrate. See Japanese Patent Kokai Publication No. H01-157796 (which is referred to also as "Patent literature 2") and "Electronics Packaging Technology", issued on September, 2000, pp. 38-45 (which is referred to also as "Non-patent literature 1"), for example.

There is also another process wherein bumps are selectively formed on electrodes of a circuit substrate. In this process, the circuit substrate is immersed in a chemical solution so as to form an adhesive film only on surfaces of the electrodes of the circuit substrate. Then, solder powder is put into contact with the adhesive film so as to attach the solder powder to the electrodes. See Japanese Patent Kokai Publication No. H07-74459 (which is referred to also as "Patent literature 3"), for example.

However, when the above-mentioned processes are employed, the flip chip mounting process requires the following steps (1) and (2) due to the fact that the bumps are formed on the electrode pads of the semiconductor chip or on the electrodes of the circuit substrate:

(1) The step for forming an electrical connection between the opposed electrodes by performance of a reflow process after the formation of the bumps and the mounting of the semiconductor chip over the circuit substrate; and (2) The step for pouring an underfill resin into a clearance gap formed between the semiconductor chip and the circuit substrate so as to secure the semiconductor chip to the circuit substrate.

The steps (1) and (2) will cause an increase of the manufacturing cost.

Therefore, there is recently proposed another process. According to such process, an electrical connection is formed at desired position by disposing a film consisting of an anisotropic conductive material (which contains electrically-conductive particles) between a projected electrode of a semiconductor chip and an electrode of a circuit substrate, followed by heating and pressurizing the film. See Japanese Patent Kokai Publication No. 2000-332055 (which is referred to also as "Patent literature 4"), for example.

There is also proposed another process wherein an electrically-conductive adhesive consisting of a thermosetting resin and electrically-conductive particles is supplied between a semiconductor chip and a circuit substrate, and thereafter the semiconductor chip is pressurized and the electrically-conductive adhesive is heated. According to this process, the molten electrically-conductive particles are allowed to gather between electrodes of the semiconductor chip and electrodes of the circuit substrate. As a result, an electrical conduction between each electrode of the semiconductor chip and each electrode of the circuit substrate is formed, and also a bonding between the semiconductor chip and the circuit substrate is formed. See Japanese Patent Kokai Publication No. 2004-260131 (which is hereinafter referred to also as "Patent literature 5"), for example.

SUMMARY OF THE INVENTION

In the technology disclosed in Patent literature 5, a curing temperature of the thermosetting resin is above a melting point of the electrically-conductive particles. Despite this, as a general rule, the viscosity of the supplied electrically-conductive adhesive gradually increases as a polymerization thereof proceeds (the polymerization being brought about by the heating). Therefore, a mobility of the melted electrically-conductive particles is impaired due to the viscosity increase of the adhesive. As a result, there may be occurred a problem that a part of the electrically-conductive particles is left outside of the region formed between each electrode of the semiconductor chip and each electrode of the circuit substrate, which will lead to a deterioration of electrical insulating properties at the region located between the neighboring electrodes.

The present invention is directed to solve the above problem. That is to say, an object of the present invention is to provide a composition that can solve a problem attributable to the viscosity increase. Also, another object of the present invention is to provide a satisfactory flip chip mounting process and a satisfactory bump-forming process in terms of a prevented short-circuit and thus in terms of a connecting reliability.

Means for Solving the Problems

In order to solve the above problem, the present invention provides a composition comprising a first component, a second component, metal particles and a convection additive wherein the metal particles are dispersed in the second component, and the convection additive is contained in the second component;

the first component is contained in an interior of at least one of the metal particles, wherein the metal particles melt upon heating so that the first component comes in contact with the second component to form a thermoset resin; and the convection additive is capable of generating a gas upon heating.

It is preferred that the first component is a curing agent or a curing promoter (accelerator) used for forming the thermoset resin, whereas the second component is a base resin used for forming the thermoset resin.

The composition of the present invention is at least characterized in that the first component is built in at least one of the metal particles that are dispersed in the second component (i.e., at lease one of the metal particles dispersed in the second component has a built-in first component). Thus, a curing reaction between the first component and the second component is not initiated until the metal particles melt. In other words, when a temperature reaches a melting point of the metal particles, the curing reaction is initiated so that the viscosity of the composition increases. As a result, the viscosity of the composition is kept low during the starting phase of the heating (that is to say, "pot life" regarding the composition of the present invention is long).

The composition of the present invention is also characterized in that the convection additive is contained therein. When the convection additive is heated, it boils to generate a gas or it is decomposed to generate a gas. Due to the movement of the generated gas, a convection effect is provided within the composition, which allows the movement of the metal particles. Thus, for example, in a case where the composition of the present invention is supplied between a semiconductor chip and a circuit substrate in the flip chip mounting process, followed by being heated, the metal particles can easily self-assemble into a region between each electrode of the semiconductor chip and each electrode of the circuit substrate due to wettability of the electrodes (i.e., due to the fact that the electrodes have high wettability to the metal particles). As a result, electrical connections can be formed, each of which serves to interconnect the opposed electrodes electrically. By the way, it is preferred that the convection additive is at least one material selected from the group consisting of xylene, isobutyl alcohol, isopentyl alcohol, butyl acetate, tetrachlorethylene, methyl isobutyl ketone, ethyl carbitol, butyl carbitol, ethylene glycol, aluminum hydroxide, dawsonite, ammonium metaborate, barium metaborate and sodium hydrogen carbonate.

In a preferred embodiment, the curing agent is at least one material selected from the group consisting of aliphatic amine, aromatic amine, aliphatic acid anhydride, cycloaliphatic acid anhydride, organic peroxide and polybasic acid; and the base resin is at least one material selected from the group consisting of epoxy resin, unsaturated polyester resin, alkyd resin, polybutadiene resin, polyimide resin, polyamide resin and cyanate resin.

In a preferred embodiment, a metal component constituting the metal particles is at least one alloy selected from the group consisting of Sn—Pb alloy, Sn—Ag alloy, Sn—Ag—Cu alloy, Sn—Bi—Ag—In alloy, Sn—Bi—Zn alloy, Sn—Bi—Ag—Cu alloy, Sn—Zn alloy and Sn—Sb alloy.

It is preferred that the composition of the present invention is in paste form or in sheet form. It is also preferred that a content of a metal component constituting the metal particles ranges from 0.5 to 30% by volume with respect to the composition.

In a preferred embodiment, a melting point of a metal component constituting the metal particles is between a curing reaction-initiating temperature and a peak temperature of the curing reaction with respect to a mixture of the first component and the second component. Similarly, in a preferred embodiment, a boiling point of the convection additive is between a curing reaction-initiating temperature and a peak temperature of the curing reaction with respect to a mixture of the first component and the second component. In another preferred embodiment, the convection additive is decomposed to generate a gas under a temperature condition between a curing reaction-initiating temperature and a peak temperature of the curing reaction with respect to a mixture of the first component and the second component.

The present invention also provides a flip chip mounting process using the above-mentioned composition. The flip chip mounting process of the present invention comprises the steps of:

(i) preparing a semiconductor chip on which a plurality of electrodes (a) (or "connecting terminals") are formed and a circuit substrate on which a plurality of electrodes (b) (or "electrode terminals") are formed (wherein the electrodes (a) and the electrodes (b) can be opposed to each other when the semiconductor chip is mounted over the circuit substrate);

(ii) supplying the composition of the present invention onto a surface of the circuit substrate, such surface being provided with the electrodes (b);

(iii) bringing the semiconductor chip into contact with the supplied composition such that the electrodes (a) of the semiconductor chip are opposed to the electrodes (b) of the circuit substrate; and (iv) heating the circuit substrate, and thereby electrical connections consisting of a metal component constituting the metal particles are formed between each electrode (a) and each electrode (b), and also a thermoset resin layer is formed between the semiconductor chip and the circuit substrate.

In this flip chip mounting process, the movement of the metal particles and the molten metal component (i.e., the melted metal produced due to the melting of the metal particles) is achieved due to the convection phenomenon. As a result, the metal particles and the molten metal component are allowed to self-assemble onto the electrodes (a) and/or the electrodes (b), and thereby the electrical connection for interconnecting each electrode (a) and each electrode (b) can be formed. In addition to that, the thermoset resin layer is formed between the semiconductor chip and the circuit substrate through the contact of the first component and the second component, the contact being brought about by the melting of the metal particles. Therefore, the flip chip mounting process of the present invention can concurrently achieve "solder joint or solder connection" by use of the metal component constituting the metal particles and "formation of underfill resin layer" by use of the themoset resin.

Since the composition used for the flip chip mounting process of the present invention has a relatively long "pot life", a stability of the composition at ambient temperatures (i.e., at ordinary temperatures) is improved. Therefore, an operating efficiency upon performing the flip chip mounting process is significantly improved.

It is preferred that a plurality of the semiconductor chips are brought into contact with the supplied composition in the step (iii). The circuit substrate prepared in the step (i) may be a printed circuit board, a ceramic substrate, a glass substrate or a semiconductor wafer.

The present invention also provides a process for forming bumps using the above-mentioned composition. The process for forming bumps of the present invention comprises the steps of:

(i) preparing a circuit substrate on which a plurality of electrodes (or "electrode terminals") are formed, and also preparing a cover having release properties;

(ii) supplying the composition of the present invention onto a surface (A) of the circuit substrate, such surface (A) being provided with the electrodes;

(iii) bringing the cover into contact with the supplied composition;

(iv) heating the circuit substrate, and thereby bumps consisting of a metal component constituting the metal particles are formed on the electrodes, and also a thermoset resin layer is formed between the circuit substrate and the cover; and (v) removing (or peeling away) the cover from the thermoset resin layer.

In the process for forming bumps of the present invention, the movement of the metal particles and the molten metal component (i.e., the melted metal produced due to the melting of the metal particles) is achieved due to the convection phenomenon. As a result, the metal particles and the molten metal component are allowed to self-assemble onto the electrodes, and thereby the bumps can be formed. In addition to that, the thermoset resin layer is formed between the cover and the circuit substrate through the contact of the first component and the second component, the contact being brought about by the melting of the metal particles.

The circuit substrate prepared in the step (i) may be a printed circuit board, a ceramic substrate, a glass substrate or a semiconductor wafer.

According to the process for forming bumps of the present invention, bumps (solder bumps) having a high aspect ratio can be easily formed on the circuit substrate. Moreover, according to the process for forming bumps of the present invention, fine-pitch bumps (fine-pitch solder bumps) can be also easily formed. The simplification of the bump-forming steps can be achieved. Furthermore, the bump package region (except for a surface region on which the bumps are formed) is protected by the thermoset resin, which leads to an improvement of the reliability.

In a preferred embodiment of the process for forming bumps of the present invention, between the step (i) and step (ii), a release agent layer is formed on the surface (A) of the circuit substrate except for a surface region provided with the electrodes; and in the step (v), not only the cover is removed from the thermoset resin layer, but also the thermoset resin layer and the release agent layer are removed.

In a preferred embodiment of the process for forming bumps of the present invention, a plurality of lands are formed on a surface (B) of the cover prepared in the step (i) such that a land pattern corresponds to that of the electrodes of the circuit substrate, and also a release agent layer is formed on the surface (B) except for a surface region provided with the lands;

in the step (iii), the cover is brought into contact with the supplied composition such that the lands of the cover are opposed to the electrodes of the circuit substrate;

in the step (iv), the bumps consisting of the metal component constituting the metal particles (i.e., metal produced due to the melting of the metal particles) are formed so that the lands and the electrodes are interconnected; and in the step (v), the cover and the release agent layer are removed whereas the lands are left to remain on the bumps.

In this embodiment, the bump package region except for a surface region on which the bumps are formed is protected by the thermoset resin layer, which leads to an improvement of the connecting reliability. Also, the projecting portion of each bump, which projects upward from the surface of the thermoset resin layer, can be used for a subsequent mounting process. Since the periphery of the bumps (except for the projecting portions of bumps) is surrounded by the thermoset resin, a fine pitch of the bumps can be achieved.

It is preferred that the cover prepared in the step (i) is the following plate:

a plate made of glass;

a plate made of ceramic; or a plate that is coated with a material having release properties with respect to the thermoset resin, for example, coated with at least one material selected from the group consisting of silicone resin, fluorine resin (fluoroplastic), polypropylene resin, silicone oil, inorganic oxide, inorganic nitride and inorganic nitrided oxide. In this case, it is ensured that the cover is finally removed from the thermoset resin layer.

Similarly, the release agent layer which may be formed between the step (i) and the step (ii) of the process for forming bumps is preferably made of some material having release properties with respect to the thermoset so as to ensure a subsequent removal of the cover. For example, it is preferred that the release agent layer is formed by applying at least one material selected from the group consisting of silicone resin, fluorine resin, polypropylene resin, silicone oil, inorganic oxide, inorganic nitride and inorganic nitrided oxide.

Furthermore, the present invention provides a semiconductor package that is obtained by dividing the semiconductor wafer on which the bumps are formed by performance of the above process (i.e., the process for forming bumps of the present invention) into pieces. That is to say, a chip size package (CSP) can be easily obtained by performance of the process for forming bumps of the present invention.

Due to the fact that the first component is built in at least one of the metal particles dispersed in the second component, the composition of the present invention provides an advantageous effect. In particular, in a case where the composition of the present invention is used for a flip chip mounting process or a process for forming bumps, the viscosity of the composition is kept low during the starting phase of the heating since a curing reaction between the first component and the second component is not initiated until the metal particles melt. As a result, the convection effect (which is occurred due to the convection additive or a buoyant force based on the thermal motion) is not adversely affected during the starting phase of the heating, and thereby a smooth movement of the metal particles can be performed within the composition.

Therefore, the following matters can be concluded:

According to the prior art wherein a pre-mixed composition of a curing agent and a base resin for a thermoset resin (e.g., epoxy resin) is used, the composition has a short "pot life". As a result, the curing reaction is already initiated and the composition viscosity increases during the step of applying the composition onto the circuit substrate or during the starting phase of heating the circuit substrate, and thereby the occurrence of the convection phenomenon may be suppressed so that the self-assembly or the like of the metal particles is adversely affected.

On the other hand, the present invention takes a long time between a initiation of the heating and a completion of the curing reaction since a curing reaction between the first component and the second component is not initiated until the metal particles melt. As a result, a satisfactory convection effect is provided so that the self-assembly of the metal particles is achieved wherein the metal particles are allowed to move onto the electrodes or into a region between the opposed electrodes.

As described above, in a case where the composition of the present invention is used for a flip chip mounting process or a process for forming bumps, the metal particles are allowed to efficiently self-assemble onto the electrodes or into a region between the opposed electrodes. It is thus possible to reduce a amount of the residual metal particles that are left outside of electrodes or outside of the region between the opposed electrodes, which will lead to a prevention of the short-circuit. As a result, an excellent connecting reliability between the opposed electrodes is achieved.

BRIEF DESCRIPTION OF THE DRAWINGS

FIGS. 2B(a) to 2B(d) show cross-sectional views illustrating the steps in a flip chip mounting process of the present invention according to the first embodiment.

FIGS. 2B(a) to 2B(d) show cross-sectional views illustrating the steps in a flip chip mounting process of the present invention according to the first embodiment.

Figure 1A:
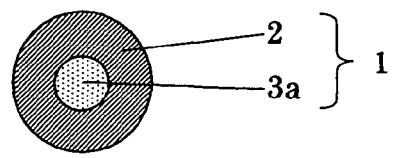
FIG. 1A shows a cross-sectional view illustrating a metal particle contained in a composition of the present invention, and particularly a metal particle having a metal layer and a core region in which a first component is contained.

In the drawings, the reference numbers correspond to the following elements:

1, 21, 31, 51: Metal particle having a metal layer and a core region in which a first component is contained

1', 21', 31', 51': Metal particle made of metal material (or solder material) as a whole

1": Melted metal component (melted metal particle 1 and melted metal layer 2)

21": Melted metal component (melted metal particle 21 and melted metal layer 22)

2, 22, 32, 52: Metal layer (solder material layer)
20: Cylindrical metal member
3a, 23a, 33a, 53a: First component
3b, 23b, 33b, 53b: Second component
3c, 23c, 33c, 53c: Thermoset resin or thermoset resin layer
4, 24, 34, 54: Composition of the present invention (metal particles-dispersed composition)
5, 25: Electrode (Electrode (b)) of circuit substrate
6, 26: Circuit substrate
7: Electrode (Electrode (a)) of semiconductor chip
8: Semiconductor chip
9, 28, 36, 55: Gas generated from convection additive
10: Connection (solder connection)
27, 41, 63: Cover having release properties
29, 58 Bump (solder bump)
35, 43: Release agent layer
42: Land
56: Bump body
57: Top of bump (projecting portion of bump)
61: Electrode of semiconductor wafer
62: Semiconductor wafer
64: Dicing line
65, 66: Semiconductor package

DETAILED DESCRIPTION OF THE INVENTION

With reference to the attached drawings, a few embodiments of the present invention will be hereinafter described. As to the drawings, the constituent elements having substantially the same function carry the same reference number for ease of the description.

(Metal Particles-Dispersed Composition)

A metal particles-dispersed composition of the present invention will be described. The metal particles-dispersed composition comprises a first component, a second component, metal particles and a convection additive. The second component can serve as a continuous phase in which the metal particles are dispersed. The convection additive is contained in the second component so that a mixture of the convection additive and the second component is formed. In a case where the convection additive is in liquid form, the convection additive and the second component serve as a continuous phase. In a case where the convection additive is in solid form or powder form, the convection additive is dispersed in the second component. The first component is contained in an interior of at least one of the metal particles.

(Metal Particles)

Figure 1B:
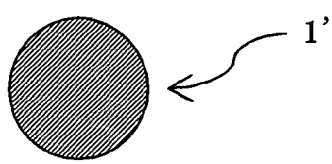
FIG. 1B shows a cross-sectional view illustrating a metal particle contained in a composition of the present invention, and particularly a metal particle having no first component and thus made of metal material as a whole.

It is preferred that at least one of the metal particles has the first component in the core region thereof. In other words, the metal particles are composed of metal particles 1 as shown in FIG. 1A and metal particles 1' as shown in FIG. 1B. In the metal particle 1 shown in FIG. 1A, the first component 3a is covered with a metal layer 2. On the other hand, the metal particle 1' shown in FIG. 1B consists of only a metal component. Since a thermoset resin is formed from the first component and the second component, the amount of the first component is determined depending on the amount of the thermoset resin to be formed. On the other hand, the amount of a metal component constituting the metal particles is determined depending on the amount of bumps or electrical connections to be formed. Therefore, in some cases, all the metal particles contained in the composition may be metal particles 1.

In a case where a content of a metal component constituting the metal particles 1,1' is less than 0.5% by volume with respect to the composition, a satisfactory size of the connections formed between the opposed electrodes cannot be obtained in the flip chip mounting process, which may cause a poor electrical conduction. On the other hand, in a case where a content of a metal component constituting the metal particles 1,1' is more than 30% by volume with respect to the composition, this may increase the surplus metal particles that have not been used for the formation of the electrical connections and thus exist as residual metal, which will cause a short-circuit at the region between the neighboring connections. It is therefore preferred that a content of a metal component constituting the metal particles 1,1' ranges from 0.5 to 30% by volume with respect to the composition.

As a metal component constituting the metal particles 1,1' (i.e., a component constituting particles 1' and metal layer 2), a conventional solder material such as Pb—Sn alloy may be used. Some solder materials that have been recently developed in terms of an environmental problem may be also used. The examples of such solder materials include Sn—Ag alloy, Sn—Ag—Cu alloy, Sn—Bi—Ag—In alloy, Sn—Bi—Zn alloy, Sn—Bi—Ag—Cu alloy and Sn—Zn alloy. In a case where the metal component constituting the metal particles 1,1' is solder material, the metal particles 1,1' can be referred to also as "solder particles".

Figure 1C:
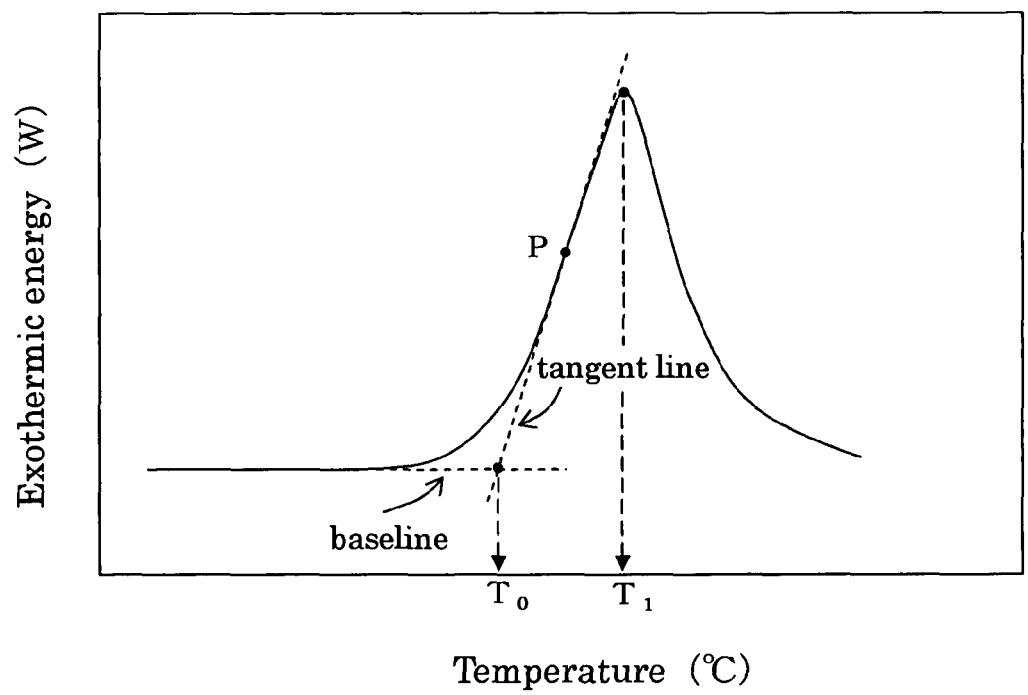
FIG. 1C shows a conceptual diagram of a DSC curve obtained from a differential scanning calorimetry for a mixture of a first component and a second component.

It is preferred that the metal component constituting the metal particles 1,1' has a melting point suitable for a flip chip mounting process and a bump-forming process. For example, it is preferred that the melting point of the metal component constituting the metal particles 1,1' is above a curing reaction-initiating temperature ($T_0$) of a mixture of the first component and the second component. It is more preferred that the melting point of the metal component constituting the metal particles 1,1' is between the curing reaction-initiating temperature ($T_0$) and a peak temperature ($T_1$) of the curing reaction with respect to the mixture of the first component and the second component. "Curing reaction-initiating temperature ($T_0$)" used herein is one as shown in FIG. 1C. Namely, in a DSC curve obtained from a differential scanning calorimetry for a mixture of the first component and the second component, the curing reaction-initiating temperature ($T_0$) is a temperature at the intersection of a baseline and a tangent line passing through an inflection point P (such inflection point P being located in a curve section rising toward an exothermic peak). Similarly, the peak temperature ($T_1$) of the curing reaction is a temperature at an exothermic peak in the DSC curve obtained from a differential scanning calorimetry for a mixture of the first component and the second component. The term "differential scanning calorimetry" used herein is a calorimetry by using a differential scanning calorimeter (Seiko Instruments Inc., DSC220) wherein a mixture of the first component and the second component charged in a sample pan (which is made of aluminum) is heated from a room temperature at a rise rate of 10° C./min.

(First Component)

The first component 3a is preferably a curing agent or a curing promoter used for forming a general thermoset resin. For example, it is preferred that the first component 3a is at least one kind of curing agent selected from the group consisting of aliphatic amine, aromatic amine, aliphatic acid anhydride, cycloaliphatic acid anhydride, organic peroxide and polybasic acid.

(Method for Producing Metal Particles)

Next, a method for producing metal particles 1 will be described. There is no limit on the method for producing metal particles 1 in the present invention. Any suitable methods can be employed as long as the first component is con tained in an interior of each of particulate metals. For example, the following methods (1) and (2) can be employed:

(1) Method by Performance of Elongation Process

Figure 1D:
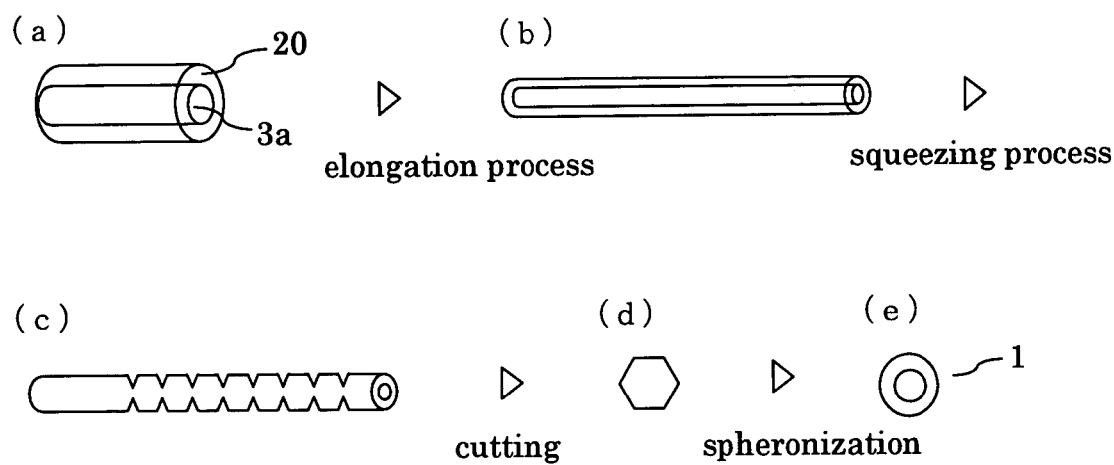
FIG. 1D shows schematic views illustrating the steps in a process for manufacturing metal particles, each of which has a metal layer and a core region in which a first component is contained.

FIG. 1D shows schematic views illustrating a method for producing the metal particles 1 by performance of an elongation process. Firstly, as shown in FIG. 1D(*a*), a metal cylinder 20 in which the first component 3*a* is deposited is formed, followed by being elongated as shown in FIG. 1D(*b*). These are performed by means of an extrusion die so as to form a thin elongated metal member. Subsequently, a plurality of squeezed or dented portions of the metal member are formed at a desired spacing (see FIG. 1D(*c*)), and thereafter the metal member is divided into pieces by cutting it at the squeezed or dented portions (see FIG. 1D(d)). After that, a spheronization process is performed if needed. As a result, the metal particles 1 as shown in FIG. 1D(*e*) are obtained.

(2) Method by Performance of Embossing Process

Firstly, the first component is applied on a first metal plate, and thereafter a second metal plate is disposed on the supplied first component. Subsequently, the first metal plate and the second metal plate are welded with pressure by an embossing press machine, followed by cutting the welded plates into pieces. As a result, the metal particles 1 are obtained.

(Second Component)

The second component may be any suitable ones as long as they are capable of forming a thermoset resin through a contact with the first component. It is preferred that the second component is a base resin used for forming a general thermoset resin. For example, it is preferred that the second component is a base resin used for forming at least one thermoset resin selected from the group consisting of epoxy resin, unsaturated polyester resin, alkyd resin, polybutadiene resin, polyimide resin, polyamide resin and cyanate resin. In a case where the composition having a paste form or a sheet form is desirable, the second component having higher viscosity is preferably used.

As described above, it is preferred that the first component is a curing agent or a curing promoter used for forming the thermoset resin whereas the second component is a base resin used for forming the thermoset resin. However, it is also preferred that the first component is a base resin used for forming the thermoset resin whereas the second component is a curing agent or a curing promoter used for forming the thermoset resin.

Furthermore, the second component may be some material capable of initiating its curing process or promoting its curing process after the melting of the metal particles.

(Convection Additive Contained in Composition)

The convection additive may be any suitable ones as long as they can provide a convection effect within the composition when being heated. It is preferred that the convection additive boils so as to generate a gas when it is heated. It is also preferred that the convection additive is decomposed to generate or release a gas when it is heated. For example, the convection additive is preferably at least one material selected from the group consisting of xylene, isobutyl alcohol, isopentyl alcohol, butyl acetate, tetrachlorethylene, methyl isobutyl ketone, ethyl carbitol, butyl carbitol, ethylene glycol, aluminum hydroxide, dawsonite, ammonium metaborate, barium metaborate and sodium hydrogen carbonate.

It is preferred that convection additive has physical properties suitable for a flip chip mounting process and a bump-forming process. For example, it is preferred that a boiling point of the convection additive is between a curing reaction-initiating temperature ($T_0$) and a peak temperature ($T_1$) of the curing reaction of a mixture of the first component and the second component. It is also preferred that the convection additive is decomposed to generate gas at a temperature condition of between the curing reaction-initiating temperature ($T_0$) and the peak temperature ($T_1$) of a curing reaction with respect to a mixture of the first component and the second component. As described above, "curing reaction-initiating temperature ($T_0$)" used herein is one as shown in FIG. 1C. Namely, in a DSC curve obtained from a differential scanning calorimetry for a mixture of the first component and the second component, the curing reaction-initiating temperature ($T_0$) is a temperature at the intersection of a baseline and a tangent line passing through an inflection point P (such inflection point P being located in a curve section rising toward an exothermic peak). Similarly, the peak temperature ($T_1$) of the curing reaction is a temperature at an exothermic peak in the DSC curve obtained from a differential scanning calorimetry for a mixture of the first component and the second component. The term "differential scanning calorimetry" used herein is a calorimetry by using a differential scanning calorimeter (Seiko Instruments Inc., DSC220) wherein a mixture of the first component and the second component charged in a sample pan (which is made of aluminum) is heated from a room temperature at a rise rate of 10° C./min.

The First Embodiment

With reference to FIGS. 2A(a) to 2A(d), a flip chip mounting process using a composition of the present invention according to the first embodiment will be hereinafter described. FIG. 2A shows cross-sectional views illustrating the steps in the flip chip mounting process of the present invention according to the first embodiment. In the drawings, double circle (◎) indicates a metal particle 1 having a metal layer 2 and a core region in which the first component 3*a* is contained, whereas single circle (○) indicates a metal particle 1' made of only the metal component, and thus having no content of the first component. It should be noted that the convection additive is not shown in the drawings.

In this first embodiment, the following materials are used. As a metal component constituting the metal particles 1' and the metal layer 2, a solder material consisting of Sn—Ag—Cu alloy is used. As a first component 3*a*, dicyandiamide (curing agent) is used. As a second component 3*b*, bisphenol A type epoxy resin (base resin) is used. As a convection additive, butyl acetate is used.

Firstly, as shown in FIG. 2A(a), a metal particles-dispersed composition 4 of the present invention is applied onto a surface of a circuit substrate 6, the surface being provided with a plurality of electrodes 5 (i.e., electrodes (b)). Subsequently, a semiconductor chip 8 which is provided with a plurality of electrodes 7 (i.e., electrodes (a)) is brought into contact with a surface of the supplied composition 4. In this regard, the semiconductor chip 8 is mounted over the circuit substrate 6 such that the electrodes 7 of the semiconductor chip 8 are opposed to the electrodes 5 of the circuit substrate 6.

Subsequently, as shown in FIG. 2A(*b*), the circuit substrate 6 is heated. As the temperature rises, the viscosity of the second component 3*b* becomes lower. This allows the movement of the metal particles 1,1' Furthermore, as the temperature rises, the convection additive (butyl carbitol) boils to generate a gas 9. The generated gas 9 provides a convection effect (as indicated as an arrow A in FIG. 2A) within the composition until the gas 9 escapes to the outside. This convection effect makes it possible to promote a movement of the metal particles 1,1'

The moving metal particles 1,1' are allowed to self-assemble into a region between each electrode 7 of the semiconductor chip 8 and each electrode 5 of the circuit substrate 6 as shown in FIG. 2A(c) due to high wettability of the electrodes 5 and 7.

A metal component constituting the metal particles 1,1' melts as the temperature rises. The melted metal component agglomerates and grows so as to interconnect each electrode 7 of the semiconductor chip 8 and each electrode 5 of the circuit substrate 6. The melting of the metal component causes the melting of the metal layer 2 of the metal particle 1. Thus, the first component 3a (dicyandiamide) that has been contained in the metal particles 1 is released into the second component 3b (bisphenol A type epoxy resin), which leads to a contact of the first component 3a and the second component 3b. This contact initiates a curing reaction between the first component 3a and the second component 3b, and thereby a thermoset resin 3c is formed. The formation of the thermoset resin 3c causes a viscosity rise of the composition 4. This means that the viscosity of the composition 4 is kept low while the metal particles 1,1' are moving since the curing reaction is not yet initiated during the starting phase of the heating. As a result, the self-assembling of the metal particles 1,1' is not adversely affected during the starting phase of the heating.

The sufficient growth of the melted metal component between each electrode 7 of the semiconductor chip 8 and each electrode 5 of the circuit substrate 6 results in a formation of the connection 10 which interconnects each electrode 7 of the semiconductor chip 8 and each electrode 5 of the circuit substrate 6, as shown in FIG. 2A(d). Also, the completion of the curing reaction between the first component 3a and the second component 3b results in a formation of a thermoset resin layer 3c located between the circuit substrate 6 and the semiconductor chip 8, and thereby the semiconductor chip 8 is mechanically secured to the circuit substrate 6.

In this way, the flip chip mounting process of the present invention according to the first embodiment can concurrently achieve "solder joint or solder connection" by use of the metal component and "formation of underfill resin" by use of the themoset resin.

According to the first embodiment, prior to the melting of the metal particles 1,1', the metal particles 1,1' self-assemble into a region between each electrode 7 of the semiconductor chip 8 and each electrode 5 of the circuit substrate 6. In this regard, however, the metal particles 1,1' may melt while they are moving (see FIGS. 2B(a) to 2B(d), particularly FIG. 2B(c)) as long as the self-assembly of the metal particles 1,1' is not adversely affected. In this case, the movement/self-assembly of the metal particles 1,1' and a molten metal component is performed at the same time when the curing reaction between the first component and the second component proceeds.

The Second Embodiment

Figure 3A:
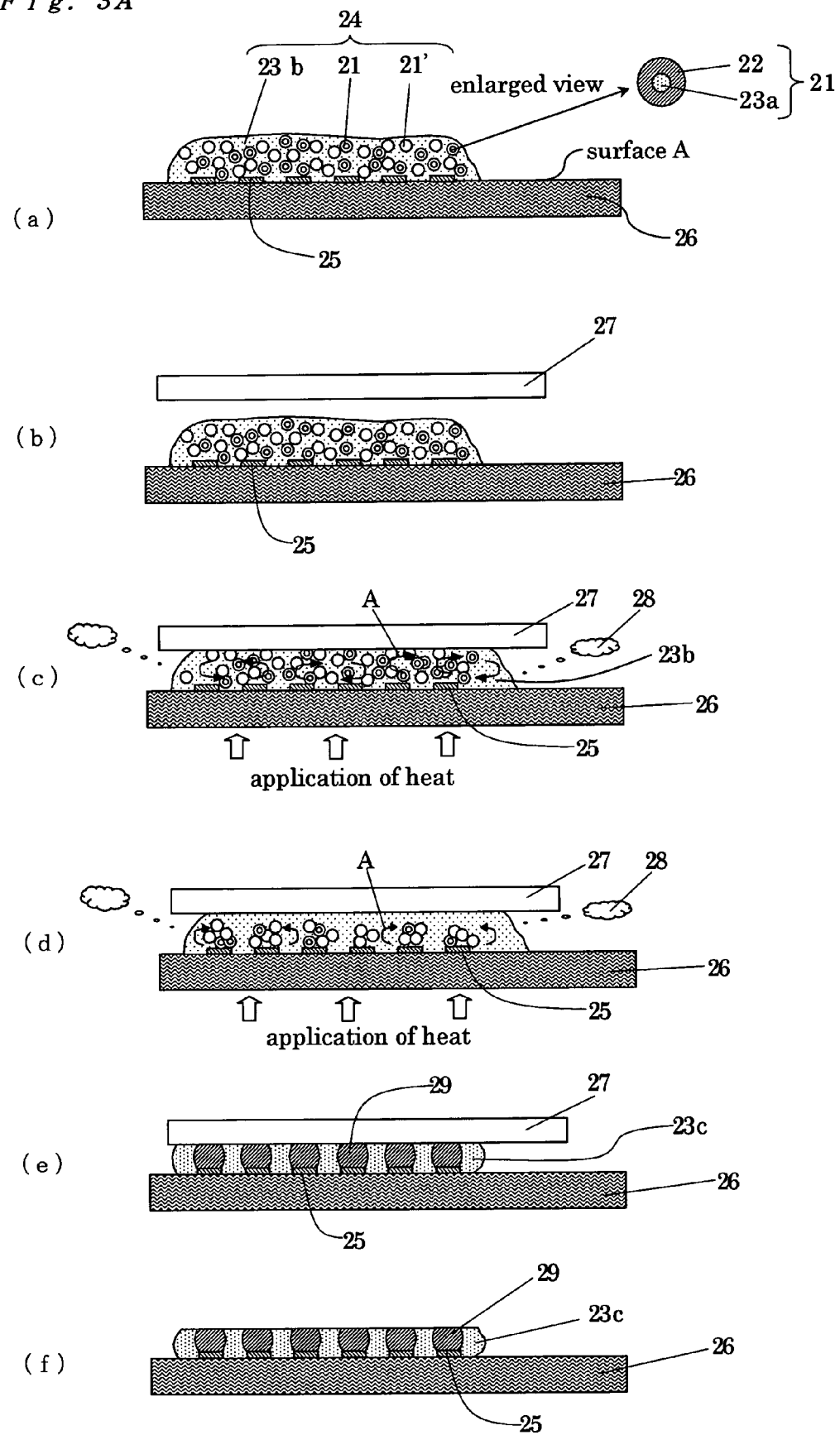
FIGS. 3A(a) to 3A(f) show cross-sectional views illustrating the steps in a bump-forming process of the present invention according to the second embodiment.

With reference to FIGS. 3A(a) to 3A(f), a process for forming bumps using a composition of the present invention according to the second embodiment will be hereinafter described. FIGS. 3A(a) to 3A(f) show cross-sectional views illustrating the steps in the process for forming bumps of the present invention according to the second embodiment.

In the second embodiment, the following materials are used. As a metal component constituting the metal particles 21' and the metal layer 22, a solder material consisting of Pb—Sn alloy is used. As a first component 23a, a chain aliphatic amine, e.g., ethylenediamine (curing agent) is used. As a second component 23b, bisphenol F type epoxy resin (base resin) is used. As a convection additive, a liquid mixture of butyl carbitol and isobutyl alcohol is used.

Firstly, as shown in FIG. 3A(a), a metal particles-dispersed composition 24 of the present invention is applied onto a surface (surface (A)) of a circuit substrate 26, the surface (surface (A)) being provided with a plurality of electrodes 25.

Subsequently, as shown in FIG. 3A(b), a cover 27 having release properties is brought into contact with a surface of the supplied composition 24. In this regard, the cover 27 having release properties is a plate made of polypropylene resin or the like.

Next, as shown in FIG. 3A(c), the circuit substrate 26 is heated. As the temperature rises, the viscosity of the second component 23b (bisphenol F type epoxy resin) becomes lower. This allows the movement of the metal particles 21,21'. Furthermore, as the temperature rises, the convection additive (liquid mixture of butyl carbitol and isobutyl alcohol) boils to generate a gas 28. The generated gas 28 provides a convection effect (as indicated as an arrow A in FIG. 3A) within the composition until the gas 28 escapes to the outside. This convection effect makes it possible to promote a movement of the metal particles 21,21'.

The moving metal particles 21,21' are allowed to self-assemble onto a surface of each electrode 25 of the circuit substrate 26 as shown in FIG. 3A(d) due to high wettability of the electrodes 25.

A metal component constituting the metal particles 21,21' melts as the temperature rises. The melted metal component agglomerates and grows toward a surface of the cover 27 from a surface of each electrode 25. The melting of the metal component causes the melting of the metal layer 22 of the metal particle 21. Thus, the first component 23a (ethylenediamine) that has been contained in the metal particles 21 is released into the second component 23b (bisphenol F type epoxy resin), which leads to a contact of the first component 23a and the second component 23b. This contact imitates a curing reaction between the first component 23a and the second component 23b, and thereby a thermoset resin 23c is formed. The formation of the thermoset resin 23c causes a viscosity rise of the composition 24. This means that the viscosity of the composition 24 is kept low while the metal particles 21,21' are moving since the curing reaction is not yet initiated during the starting phase of the heating. As a result, the self-assembling of the metal particles 21,21' is not adversely affected during the starting phase of the heating. In other words, the melted metal component has already been growing from the surface of each electrode 25 by the time the curing reaction between the first component and the second component proceeds.

The sufficient growth of the melted metal component, which has grown from the surface of each electrode 25 to a surface of the cover 27, results in a formation of the bumps (solder bumps) 29, as shown in FIG. 3A(e). Also, the completion of the curing reaction between the first component 23a and the second component 23b results in a formation of a thermoset resin layer 23c located between the circuit substrate 26 and the cover 27.

Subsequently, the cover 27 is removed (or peeled away) from the thermoset resin layer 23c. Since the cover 23c is a plate made of polypropylene resin or the like which has no adhesiveness to a thermoset resin, the cover 27 can be easily removed from the thermoset resin layer 23c. As a result, the circuit board 26 on which the bumps (solder bumps) 29 are formed can be obtained, as shown in FIG. 3A(f).

In a case where a semiconductor chip is flip chip connected to the obtained circuit substrate 26, the thermoset resin layer 23c may be removed from the circuit substrate 26 prior to the flip chip connection (not shown).

Figure 3B:
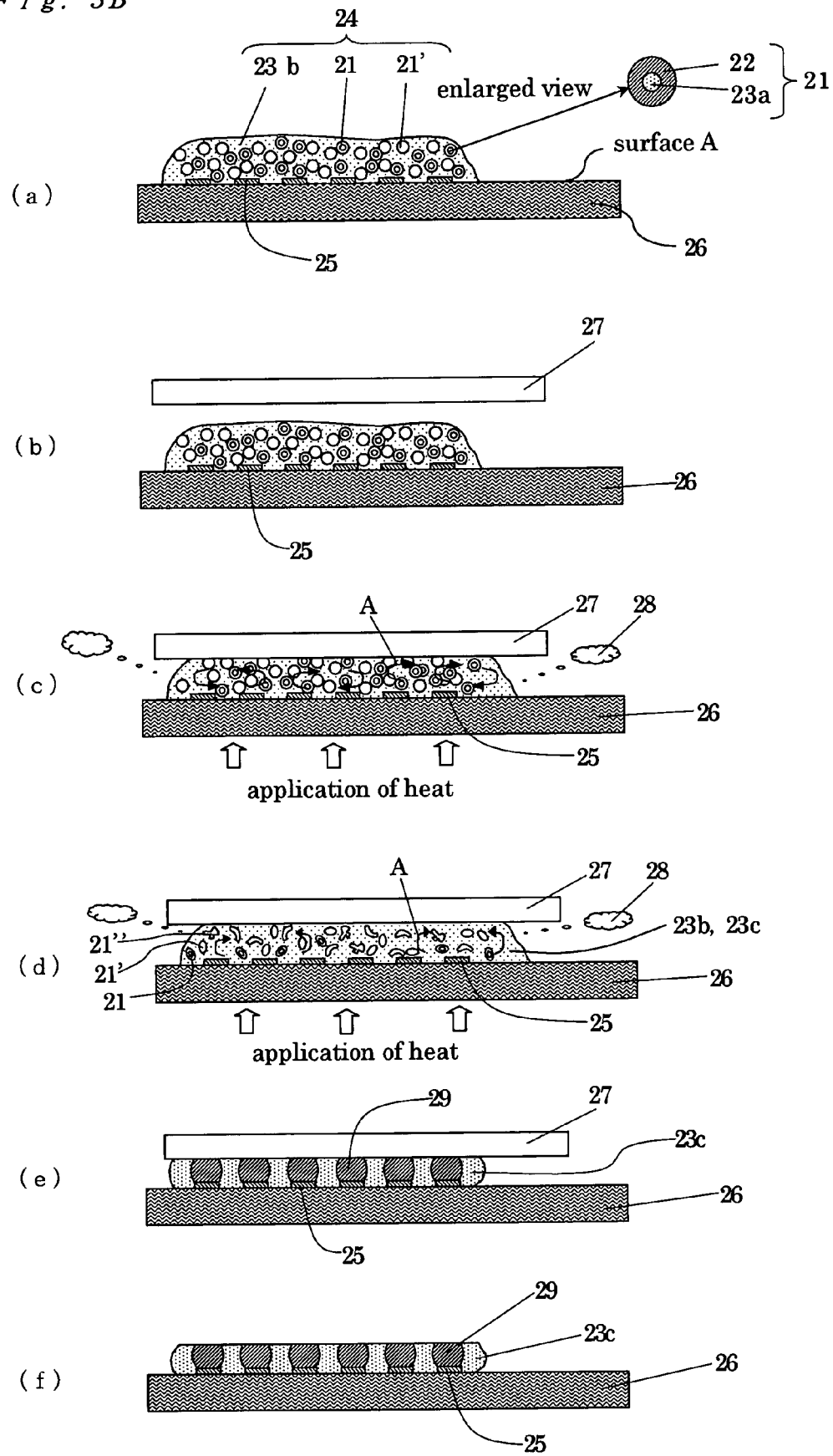
FIGS. 3B(a) to 3B(f) show cross-sectional views illustrating the steps in a bump-forming process of the present invention according to the second embodiment.

According to the second embodiment, prior to the melting of the metal particles 21,21', the metal particles 21,21' self-assemble onto each electrode 25 of the circuit substrate 26. In this regard, however, the metal particles 21,21' may melt while they are moving (see FIGS. 3B(a) to 3B(f), particularly FIG. 3B(d)) as long as the self-assembly of the metal particles 21,21' is not adversely affected. In this case, the movement/self-assembly of the metal particles 21,21' and a molten metal component is performed at the same time when the curing reaction between the first component and the second component proceeds.

The Third Embodiment

With reference to FIGS. 4(a) to 4(g), a process for forming bumps of the present invention using a composition of the present invention according to the third embodiment will be hereinafter described. FIGS. 4(a) to 4(g) show cross-sectional views illustrating the steps in the process for forming bumps of the present invention according to the third embodiment.

In the third embodiment, the following materials are used. As a metal component constituting the metal particles 31' and the metal layer 32, a solder material consisting of Pb—Sn alloy is used. As a first component 33a, phthalic anhydride is used. As a second component 33b, glycerin-based compound is used. As a convection additive, ammonium metaborate is used.

Firstly, by performance of a coating method using a release agent (e.g., silicone oil), a release agent layer 35 is formed on a surface (surface (A)) of a circuit substrate 26 except for a surface region provided with the electrodes 25 (see FIG. 4(a)). Subsequently, a metal particles-dispersed composition 34 of the present invention is applied onto each electrode 25 and the release agent layer 35.

Next, as shown in FIG. 4(b), a cover 27 having release properties is brought into contact with a surface of the supplied composition 34. In this regard, such cover 27 having release properties is a plate made of silicone resin or the like.

Figure 4:
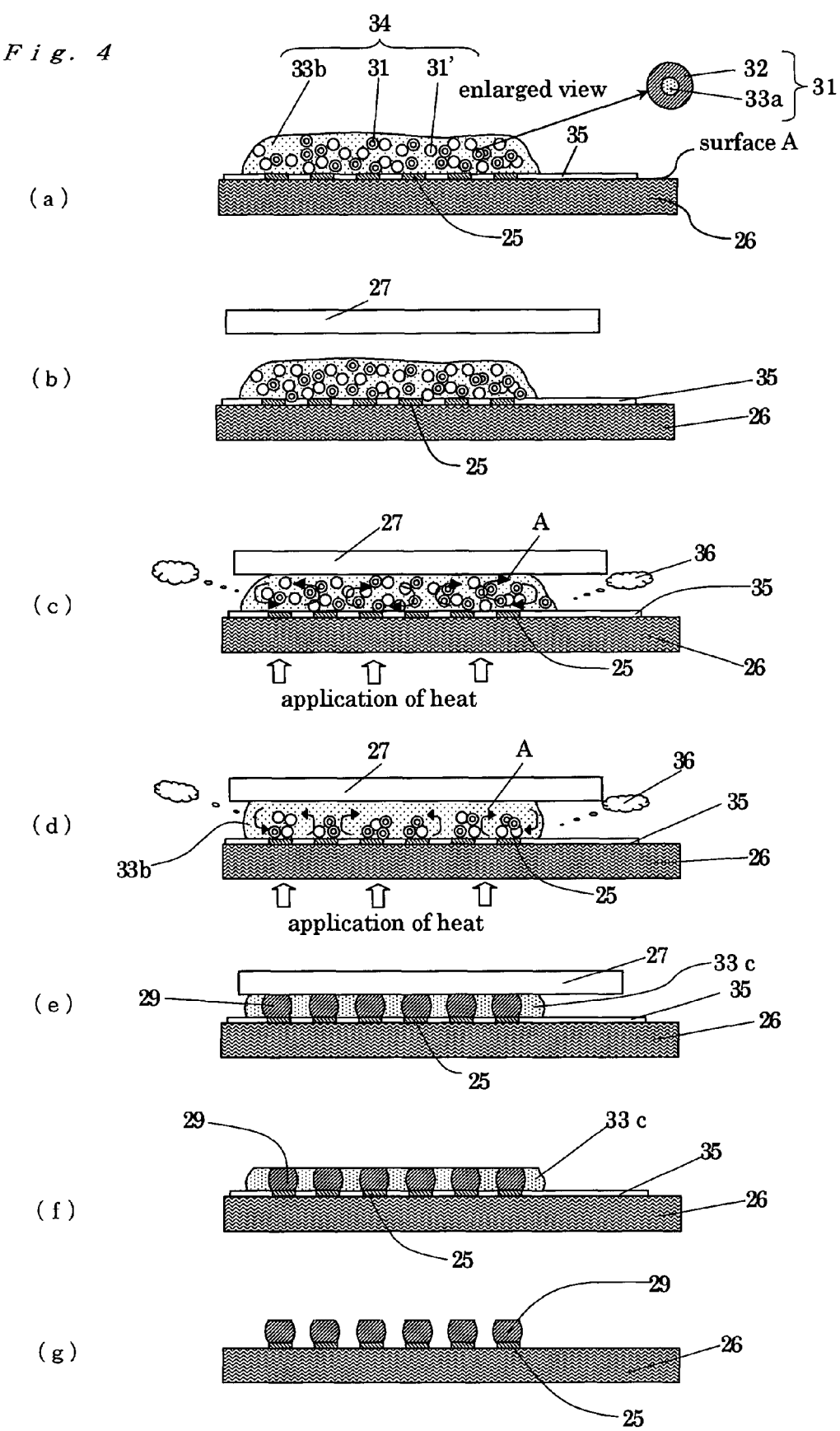
FIGS. 4(a) to 4(g) show cross-sectional views illustrating the steps in a bump-forming process of the present invention according to the third embodiment.

Next, as shown in FIG. 4(c), the circuit substrate 26 is heated. As the temperature rises, the viscosity of the second component 33b (glycerin-based compound) becomes lower. This allows the movement of the metal particles 31,31'. Furthermore, as the temperature rises, the convection additive (ammonium metaborate) is decomposed to generate a gas 36. The generated gas 36 provides a convection effect (as indicated as an arrow A in FIG. 4) within the composition consisting primarily of the second component 33b until the gas 36 escapes to the outside. This convection effect makes it possible to promote a movement of the metal particles 31,31'.

The moving metal particles 31,31' are allowed to self-assemble onto each electrode 25 of the circuit substrate 26 as shown in FIG. 4(d) due to high wettability of the electrodes 25.

A metal component constituting the metal particles 31,31' melts as the temperature rises. The melted metal component agglomerates and grows toward a surface of the cover 27 from a surface of each electrode 25. The melting of the metal component causes the melting of the metal layer 32 of the metal particle 31. Thus, the first component 33a (phthalic anhydride) that has been contained in the metal particles 31 is released into the second component 33b (glycerin-based compound), which leads to a contact of the first component 33a and the second component 33b. This contact initiates a curing reaction between the first component 33a and the second component 33b, and thereby a thermoset resin 33c is formed. The formation of the thermoset resin 33c causes a viscosity rise of the composition 34. This means that the viscosity of the composition 34 is kept low while the metal particles 31,31' are moving since the curing reaction is not yet initiated during the starting phase of the heating. As a result, the self-assembling of the metal particles 31,31' is not adversely affected during the starting phase of the heating. In other words, the melted metal component has already been growing from the surface of each electrode 25 by the time the curing reaction between the first component and the second component proceeds.

The sufficient growth of the melted metal component, which has grown from the surface of each electrode 25, results in a formation of the bumps (solder bumps) 29, as shown in FIG. 4(e). Also, the completion of the curing reaction and the subsequent cooling of the resulting thermoset resin result in a formation of a thermoset resin layer 33c located between the circuit substrate 26 and the cover 27.

Subsequently, the cover 27 is removed (or peeled away) from the thermoset resin layer 33c as shown in FIG. 4(f), and thereafter the thermoset resin layer 33c and the release agent layer 35 are removed. As a result, the circuit board 26 on which the bumps 29 are left to remain can be obtained, as shown in FIG. 4(g).

The Fourth Embodiment

Figure 5:
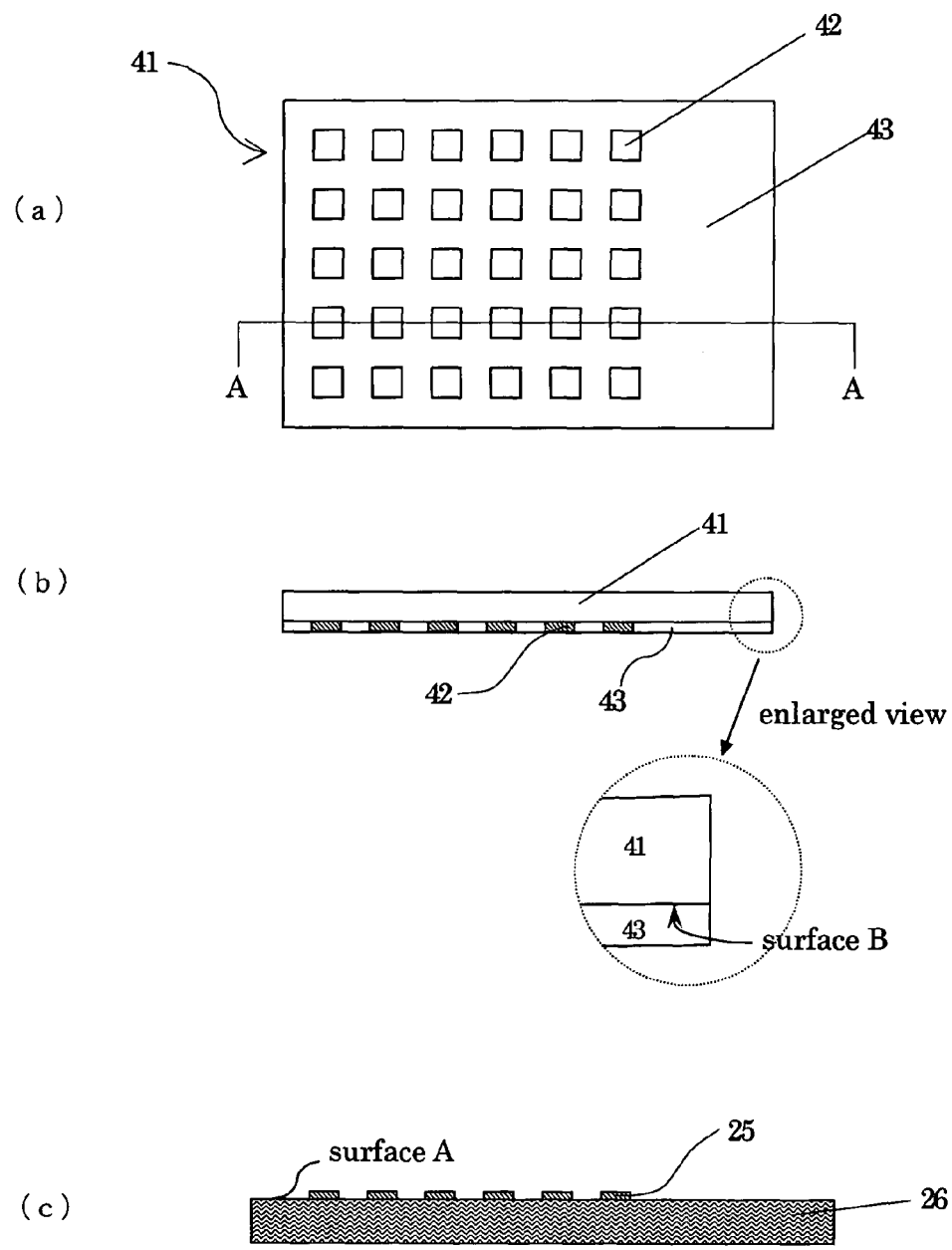
FIGS. 5(a) and 5(b) show a top plan view and a cross-sectional view (taken along the line A-A) illustrating a cover having release properties that is used for a bump-forming process of the present invention according to the fourth embodiment.
FIG. 5(c) shows a cross-sectional view illustrating a circuit substrate that is prepared according to the cover.
Figure 6:
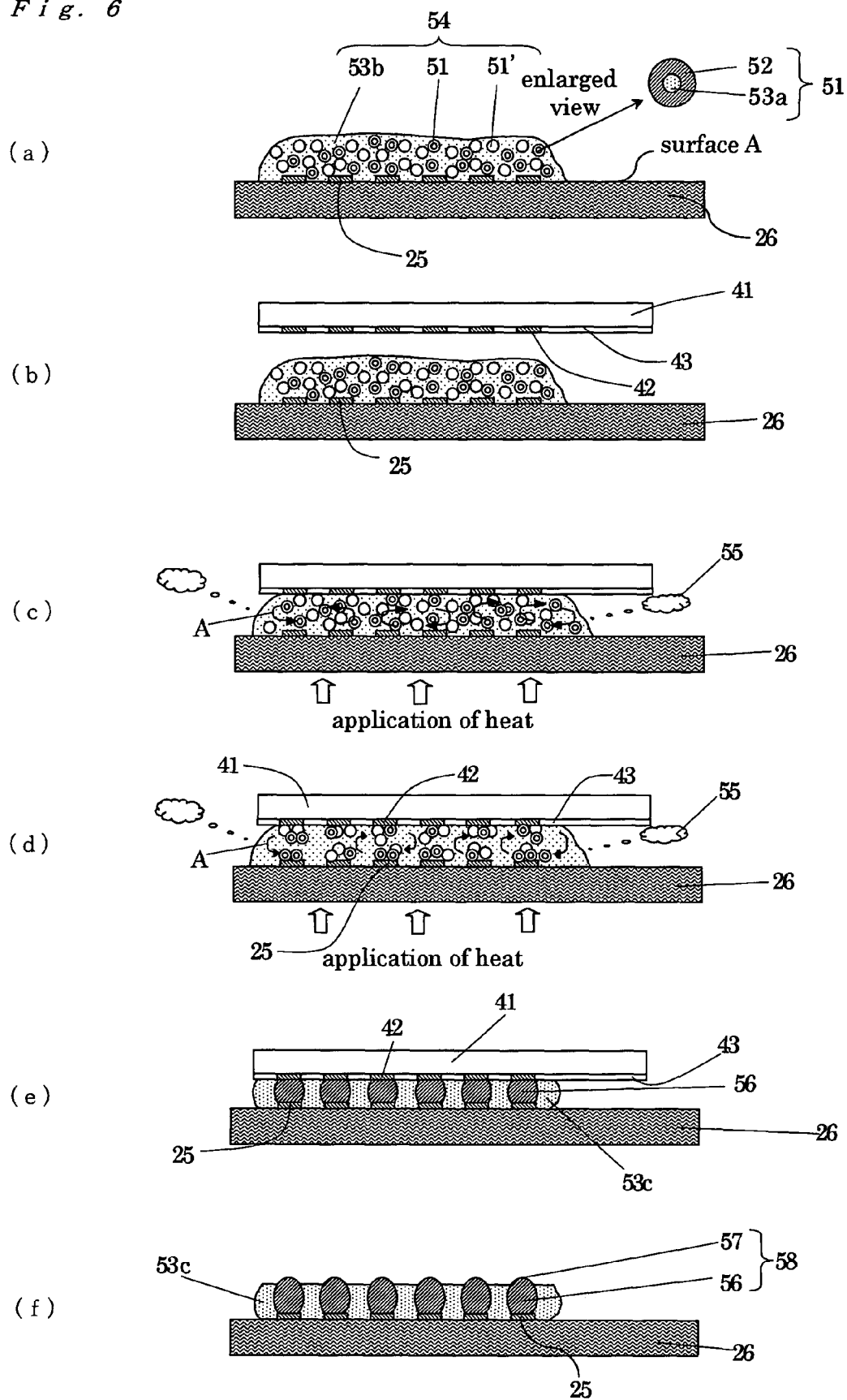
FIGS. 6(a) to 6(f) show cross-sectional views illustrating the steps in a bump-forming process of the present invention according to the fourth embodiment.

FIGS. 5(a) and 5(b) show a top plan view and a cross-sectional view illustrating a cover 41 having release properties that is used for a process for forming bumps of the present invention according to the fourth embodiment. FIG. 5(b) shows the cross-sectional view of the cover 41 taken along the line A-A of FIG. 5(a). FIG. 5(c) shows a cross-sectional view illustrating the circuit substrate 26 that is prepared according to the cover 41. FIG. 6 shows cross-sectional views illustrating the main steps in the process for forming bumps of the present invention according to the fourth embodiment.

In the fourth embodiment, the following materials are used. As a metal component constituting the metal particles 51' and the metal layer 52, a solder material consisting of Sn—Zn alloy is used. As a first component 53a, benzoyl peroxide is used. As a second component 53b, a mixture of glycol, maleic anhydride and tertiary amine (curing promoter) is used. As a convection additive, sodium hydrogen carbonate is used.

As shown in FIGS. 5(a) and 5(b), lands 42 consisting primarily of copper(Cu) and/or tin(Sn) are formed on a surface (B) of the cover according to a configuration of a plurality of electrodes 25 of a circuit substrate 26 (such configuration of the electrodes 25 of the circuit substrate 26 is shown in FIG. 5(c) in this case). Also, by performance of a coating method, a release agent layer 43 is formed on the surface (B) of the cover 41 except for a surface region provided with the lands 42. Such release agent layer consists primarily of epoxy resin that has no adhesiveness to a thermoset resin.

Firstly, as shown in FIG. 6(a), a metal particles-dispersed composition 54 is applied onto a surface (surface (A)) of the circuit substrate 26, the surface (surface (A)) being provided with the electrodes 25.

Subsequently, as shown in FIG. 6(b), the cover 27 having lands 42 and the release agent layer 43 formed thereon is brought into contact with a surface of the supplied composition 54. In this case, the cover 41 is mounted over the circuit substrate 26 such that each land 42 of the cover 41 is opposed to each electrode 25 of the circuit substrate 26.

Next, as shown in FIG. 6(c), the circuit substrate 26 is heated. As the temperature rises, the viscosity of the second component 53b becomes lower. This allows the movement of the metal particles 51,51'. Furthermore, as the temperature rises, the convection additive (sodium hydrogen carbonate) is decomposed to generate a gas 55. The generated gas 55 provides a convection effect (as indicated as an arrow A in FIG. 6) within the composition until the gas 55 escapes to the outside. This convection effect makes it possible to promote a movement of the metal particles 51,51'.

The moving metal particles 51,51' are allowed to self-assemble into a region between each electrode 25 and each land 42 as shown in FIG. 6(d) due to high wettability of the electrode 25 and the land 42.

A metal component constituting the metal particles 51,51' melts as the temperature rises. The melted metal component agglomerates and grows so as to interconnect each electrode 25 and each land 42. The melting of the metal component causes the melting of the metal layer 52 of the metal particle 51. Thus, the first component 53a (benzoyl peroxide) that has been contained in the metal particles 51 is released into the second component 53b (mixture of glycol, maleic anhydride and tertiary amine), which leads to a contact of the first component 53a and the second component 53b. This contact initiates a curing reaction between the first component 53a and the second component 53b, and thereby a thermoset resin 53c is formed.

The sufficient growth of the melted metal component between each electrode 25 and each land 42 results in a formation of a bump body 56 which electrically interconnects each electrode 25 and each land 42, as shown in FIG. 6(e). Also, the completion of the curing reaction between the first component 53a and the second component 53b results in a formation of a thermoset resin layer 53c located between the circuit substrate 26 and the cover 41.

After the thermoset resin layer 53c is formed, the cover 41 and the release agent layer 43 are removed (or peeled away) from the thermoset resin layer 53c. In this regard, when the cover 41 and the release agent layer 43 are removed while each bump body 56 is still in molten state, the lands 42 are left to remain on each bump body 56. As a result, there is provided bumps 58 (solder bumps) that respectively have projecting portions 57 with uniform height, such portions 57 being projected from a surface of the thermoset resin layer 53c.

In a case where the resulting circuit substrate having the bumps 58 are subsequently used for a flip chip mounting process using a semiconductor chip, the thermoset resin layer 53c can serving as a "member for regulating a connecting distance", which will lead to an achievement of a satisfactory flip chip mounting process in terms of an excellent connecting reliability.

In a case where a thickness of each land 42 formed on the cover 41 is approximately equal to a thickness of the release agent layer 43 formed on the cover 41 as shown in FIG. 5(b), the thermoset resin is preferably selected so as to occur a large volume shrinkage thereof during the curing process of forming the thermoset resin layer 53c.

Figure 7:
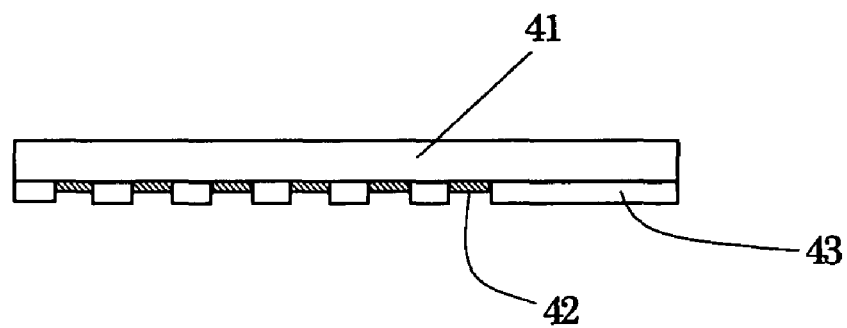
FIG. 7 shows a cross-sectional view illustrating a modified example of a cove having release properties that is used for a bump-forming process of the present invention according to the fourth embodiment.

As shown in FIG. 7, the release agent layer 43 may be thicker than the lands 42, in which case the higher projecting portions 57 of the bumps 58 can be formed.

According to the fourth embodiment, as the thermoset resin, an unsaturated polyester resin is formed from the composition comprising the first component and the second component. In this regard, however, an epoxy resin may be formed from the composition. Even in this case, the bumps can be similarly formed.

The Fifth Embodiment

Figure 8:
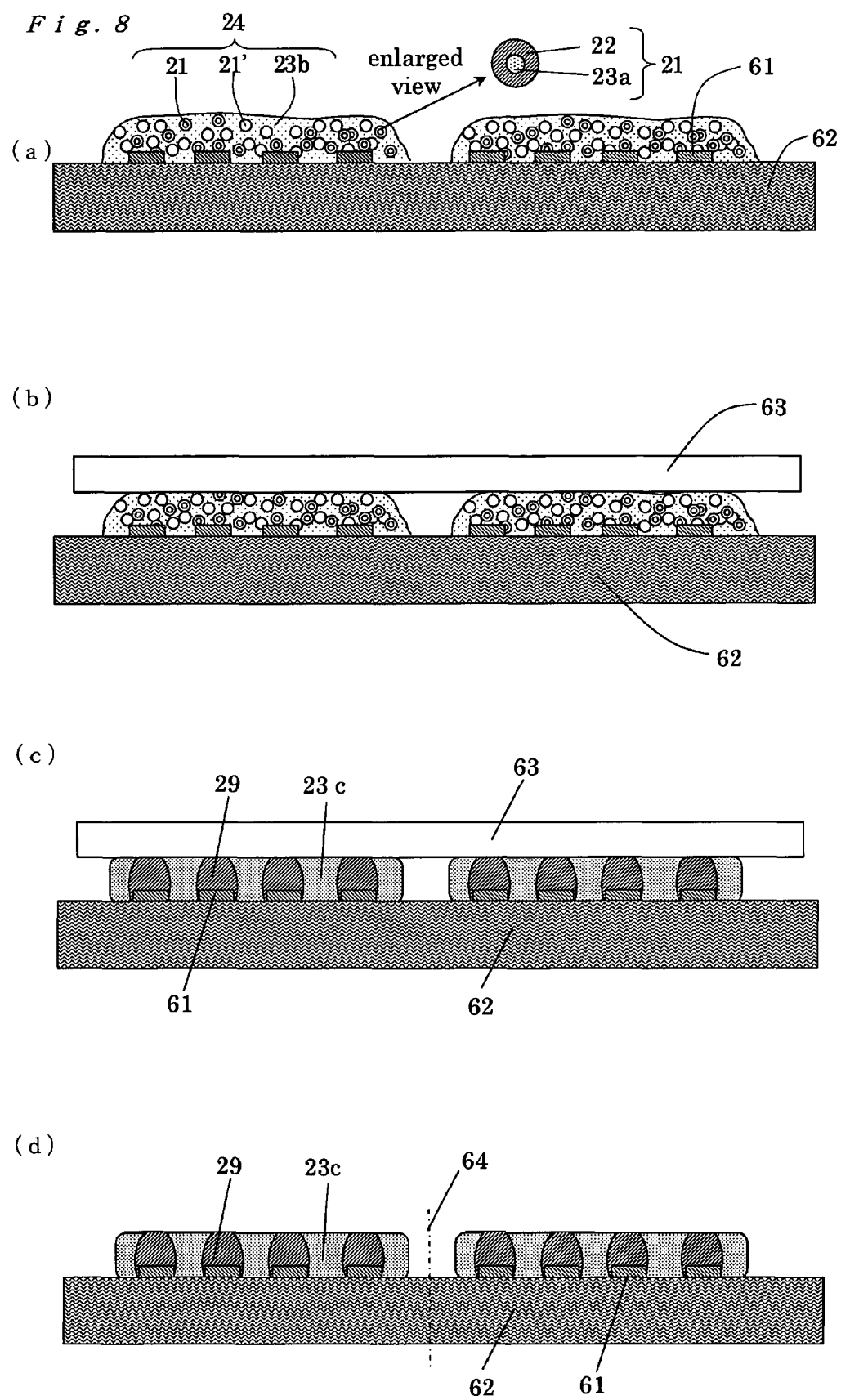
FIGS. 8(a) to 8(d) show cross-sectional views illustrating the steps in a bump-forming process of the present invention according to the fifth embodiment.
Figure 9:
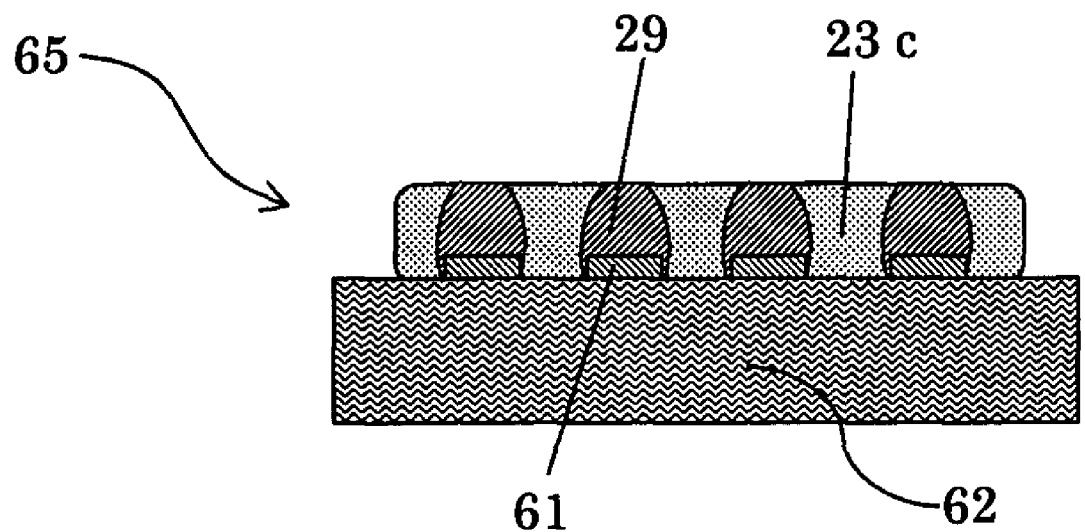
FIG. 9 shows a cross-sectional view illustrating of a semiconductor package obtained by cutting a semiconductor wafer of FIG. 8(d) into dice.

By performance of the process for forming bumps according to the fifth embodiment, not only bumps can be formed on electrodes provided in a circuit element of a semiconductor wafer, but also a region of the circuit element except for a bumps-formed surface can be protected with a resin layer. The process for forming bumps according to the fifth embodiment can achieve a formation of a chip size package (CSP). With reference to FIGS. 8 and 9, the process for forming bumps of the present invention according to the fifth embodiment will be described in detail.

FIG. 8 shows cross-sectional views illustrating the main steps in the process for forming bumps according to the fifth embodiment. FIG. 9 shows a cross-sectional view illustrating of a semiconductor package obtained from a semiconductor wafer of FIG. 8(d).

A metal particles-dispersed composition used in the fifth embodiment is the same as the composition 24 used in the second embodiment.

Firstly, as shown in FIG. 8(a), the metal particles-dispersed composition 24 is applied onto a surface of a semiconductor wafer 62, the surface being provided with electrodes 61. In this regard, however, the metal particles-dispersed composition 24 is applied only onto electrodes-formed surface regions (i.e., surface regions on which the electrodes 61 are formed) and adjacent surface regions thereof.

Subsequently, as shown in FIG. 8(b), a cover 63 having release properties (i.e., a plate made of polypropylene resin or the like) is brought into contact with a surface of the supplied composition 24. It is preferred that the size of the cover 63 is approximately the same as that of the semiconductor wafer 62. However, it may be possible to use a plurality of covers 63, each of which has the size of the corresponding "circuit element area" of the semiconductor wafer.

Next, as in the case of the second embodiment, bumps (solder bumps) 29 are formed on the electrodes 61 by performing the heating step (see FIG. 8 (c)). After that, the cover 63 is removed (see FIG. 8(d)).

Subsequently, the semiconductor wafer is cut into dice along the line 64 (i.e., dicing line 64). As a result, a semiconductor package 65 having a chip size can be obtained as shown in FIG. 9. When the semiconductor package 65 is mounted over a circuit substrate or the like by performance of a conventional flip chip mounting process, an electronic circuit substrate whose size is smaller than ever before can be obtained.

It will be understood that the cover 41 of the fourth embodiment can be used as the cover 63 of this fifth embodiment.

The Sixth Embodiment

Figure 10:
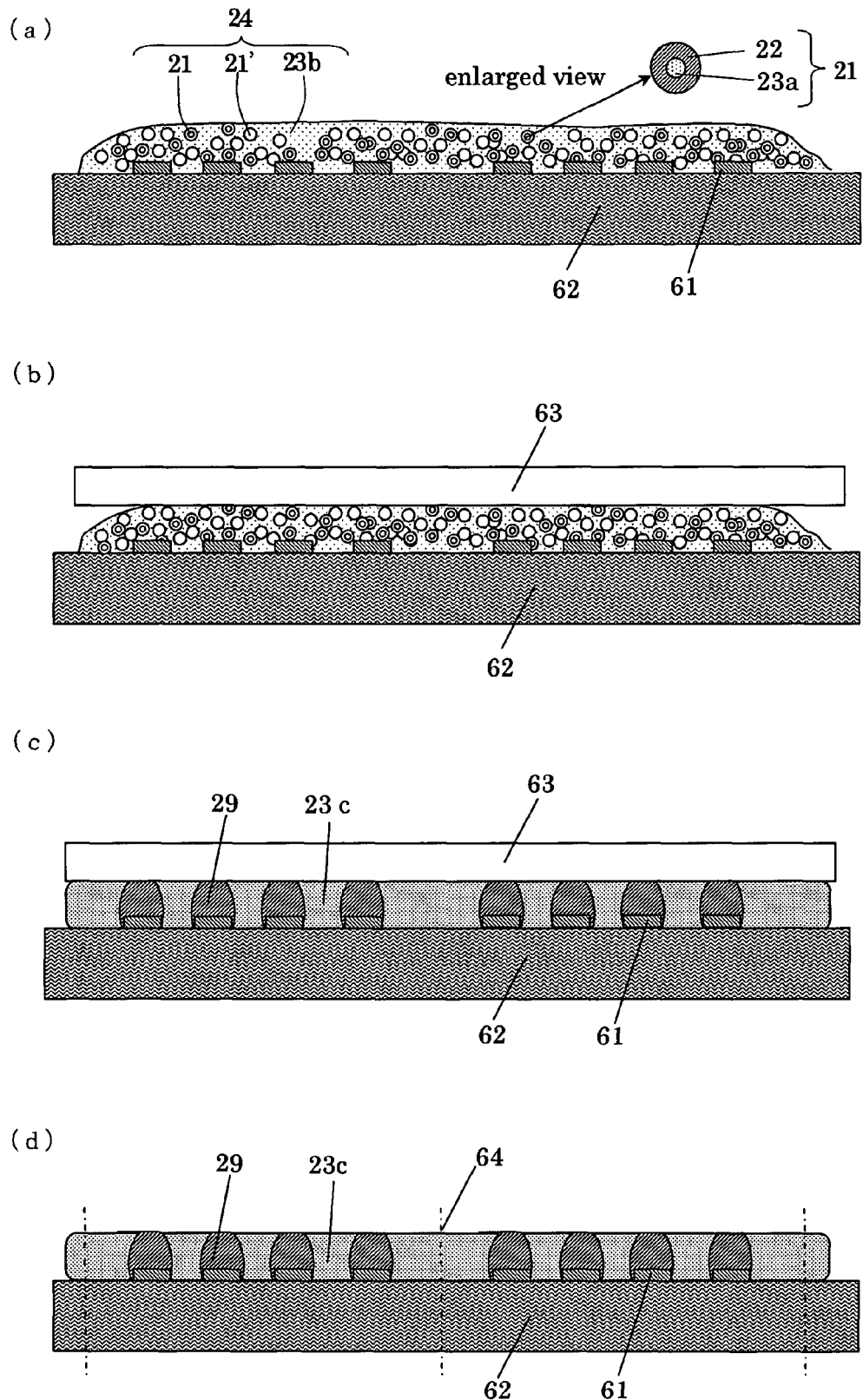
FIGS. 10(a) to 10(d) show cross-sectional views illustrating the steps in a bump-forming process of the present invention according to the sixth embodiment.
Figure 11:
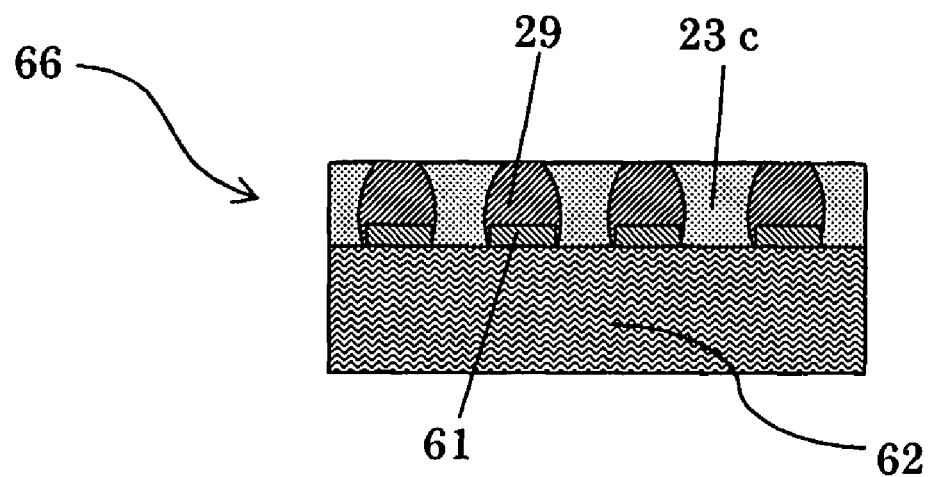
FIG. 11 shows a cross-sectional view illustrating of a semiconductor package obtained by cutting a semiconductor wafer of FIG. 10(d) into dice.

The sixth embodiment is one wherein the fifth embodiment is modified. FIG. 10 shows cross-sectional views illustrating the main steps in a process for forming bumps according to the sixth embodiment. FIG. 11 shows a cross-sectional view illustrating of a semiconductor package obtained from a semiconductor wafer of FIG. 10(d).

Although the metal particles-dispersed composition 24 is applied only onto the limited region (i.e., electrodes 61—formed surface regions and the adjacent surface regions thereof) in the fifth embodiment, the composition 24 is applied onto an approximately entire surface region of a semiconductor wafer as shown in FIG. 10(d) in the sixth embodiment. It will be noted that there is no limit on the surface region for applying the metal particles-dispersed composition 24 as long as all the electrodes 61 are covered with the applied composition 24.

The obtained semiconductor wafer is preferably cut into dice along the dicing line 64 shown in FIG. 10(d), in which case the semiconductor package 66 having a chip size can be obtained as shown in FIG. 11.

The present invention has been hereinabove described according to some embodiments. It will be however understood by those skilled in the art that the present invention is not limited to such embodiments and can be modified in various ways.

For example, instead of applying the metal particles-dispersed composition having a paste form onto the circuit substrate, the metal particles-dispersed composition that is preliminarily semi-cured and thus has a sheet form may be interposed between the circuit substrate and the semiconductor chip. Moreover, in a case where a curing reaction between the curing agent and the base resin proceeds relatively moderately, a mixture of the curing agent and the base resin may be used as the first component whereas the curing promoter may be used as the second component. In this case, the curing reaction will proceed rapidly when the first component comes in contact with the second component, such contact being brought about by the melting of the metal particles.

The present invention as described above includes the following aspects:

The first aspect: A composition comprising a first component, a second component, metal particles and a convection additive wherein said metal particles are dispersed in said second component, and said convection additive is contained in said second component;

said first component is contained in an interior of at least one of the metal particles, wherein said metal particles melt upon heating so that said first component comes in contact with said second component to form a thermoset resin; and said convection additive is capable of generating a gas upon heating The second aspect: The composition according to the first aspect, wherein said first component is a curing agent or a curing promoter used for forming said thermoset resin, whereas said second component is a base resin used for forming said thermoset resin.

The third aspect: The composition according to the second aspect, wherein said curing agent is at least one material selected from the group consisting of aliphatic amine, aromatic amine, aliphatic acid anhydride, cycloaliphatic acid anhydride, organic peroxide and polybasic acid; and said base resin is at least one material selected from the group consisting of epoxy resin, unsaturated polyester resin, alkyd resin, polybutadiene resin, polyimide resin, polyamide resin and cyanate resin.

The fourth aspect: The composition according to any one of the first to the third aspects, wherein a metal component constituting said metal particles is at least one alloy selected from the group consisting of Sn—Pb alloy, Sn—Ag alloy, Sn—Ag—Cu alloy, Sn—Bi—Ag—In alloy, Sn—Bi—Zn alloy, Sn—Bi—Ag—Cu alloy, Sn—Zn alloy and Sn—Sb alloy.

The fifth aspect: The composition according to any one of the first to the fourth aspects, wherein
said convection additive is at least one material selected from the group consisting of xylene, isobutyl alcohol, isopentyl alcohol, butyl acetate, tetrachlorethylene, methyl isobutyl ketone, ethyl carbitol, butyl carbitol, ethylene glycol, aluminum hydroxide, dawsonite, ammonium metaborate, barium metaborate and sodium hydrogen carbonate.

The sixth aspect: The composition according to any one of the first to the fifth aspects, wherein said gas provides a convection effect within said composition.

The seventh aspect: The composition according to any one of the first to sixth aspects, wherein said composition is in paste form or in sheet form.

The eighth aspect: The composition according to any one of the first to the seventh aspects, wherein a content of a metal component constituting said metal particles ranges from 0.5 to 30% by volume with respect to said composition.

The ninth aspect: The composition according to any one of the first to the eighth aspects, wherein
a melting point of a metal component constituting said metal particles is between a curing reaction-initiating temperature and a peak temperature of the curing reaction with respect to a mixture of said first component and said second component.

The tenth aspect: The composition according to any one of the first to the ninth aspects, wherein
a boiling point of said convection additive is between a curing reaction-initiating temperature and a peak temperature of the curing reaction with respect to a mixture of said first component and said second component, or
said convection additive is decomposed to generate a gas under a temperature condition between a curing reaction-initiating temperature and a peak temperature of said curing reaction with respect to a mixture of said first component and said second component.

The eleventh aspect: A flip chip mounting process wherein a semiconductor chip and a circuit substrate are electrically interconnected, said process comprising the steps of:

(i) preparing a semiconductor chip on which a plurality of electrodes (a) are formed and a circuit substrate on which a plurality of electrodes (b) are formed;

(ii) supplying the composition according to any one of the first to the tenth aspects onto a surface of said circuit substrate, such surface being provided with said electrodes (b);

(iii) bringing said semiconductor chip into contact with a surface of said composition such that said electrodes (a) of said semiconductor chip are opposed to said electrodes (b) of said circuit substrate; and (iv) heating said circuit substrate, and thereby electrical connections consisting of a metal component constituting said metal particles are formed between said electrodes (a) and said electrodes (b), and also a thermoset resin layer is formed between said semiconductor chip and said circuit substrate.

The twelfth aspect: The flip chip mounting process according to the eleventh aspect, wherein a plurality of said semiconductor chips are brought into contact with said surface of said composition in the step (iii).

The thirteenth aspect: The flip chip mounting process according to the eleventh or the twelfth aspect, wherein said circuit substrate prepared in the step (i) is a printed circuit board, a ceramic substrate, a glass substrate or a semiconductor wafer.

The fourteenth aspect: A process for forming bumps on a plurality of electrodes of a circuit substrate, comprising the steps of:

(i) preparing a circuit substrate on which a plurality of electrodes are formed, and also a cover having release properties;

(ii) supplying the composition according to any one of the first to the tenth aspects onto a surface (A) of said circuit substrate, such surface (A) being provided with said electrodes;

(iii) bringing said cover into contact with a surface of said composition;

(iv) heating said circuit substrate, and thereby bumps consisting of a metal component constituting said metal particles are formed on said electrodes, and also a thermoset resin layer is formed between said circuit substrate and said cover; and (v) removing said cover.

The fifteenth aspect: The process according to the fourteenth aspect, wherein, between the step (i) and step (ii), a release agent layer is formed on said surface (A) of said circuit substrate except for a surface region provided with said electrodes; and in the step (v), not only said cover is removed, but also said thermoset resin layer and said release agent layer are removed.

The sixteenth aspect: The process according to the fourteenth aspect, wherein, a plurality of lands are formed on a surface (B) of said cover prepared in the step (i) such that a land pattern corresponds to that of said electrodes of said circuit substrate, and also a release agent layer is formed on said surface (B) except for a surface region provided with said lands;

in the step (iii), said cover is brought into contact with the surface of said composition such that said lands of said cover are opposed to said electrodes of said circuit substrate;

in the step (iv), said bumps consisting of said metal component constituting said metal particles are formed so that said lands and said electrodes are interconnected; and in the step (v), said cover and said release agent layer are removed whereas said lands are left to remain on said bumps.

The seventeenth aspect: The process according to any one of the fourteenth to the sixteenth aspects, wherein said circuit substrate prepared in the step (i) is a printed circuit board, a ceramic substrate, a glass substrate or a semiconductor wafer.

The eighteenth aspect: The process according to any one of the fourteenth to the seventeenth aspects, wherein said cover prepared in the step (i) is the following plate:

a plate made of glass;

a plate made of ceramic; or a plate that is coated with at least one material selected from the group consisting of silicone resin, fluorine resin, polypropylene resin, silicone oil, inorganic oxide, inorganic nitride and inorganic nitrided oxide.

The nineteenth aspect: The process according to the fifteenth aspect, wherein said release agent layer is made of at least one material selected from the group consisting of silicone resin, fluorine resin, polypropylene resin, silicone oil, inorganic oxide, inorganic nitride and inorganic nitrided oxide.

The twentieth aspect: A semiconductor package obtained by forming bumps onto a semiconductor wafer serving as said circuit substrate by performance of the process according to any one of the fourteenth to the nineteenth aspects, followed by dividing said semiconductor wafer into pieces.

The twenty-first aspect: A composition comprising a curing agent, a base rein, a curing promoter, metal particles and a convection additive wherein the metal particles are dispersed in a mixture of said curing agent and the base resin, and said convection additive is contained in said mixture of said curing agent and the base resin;

said curing promoter is contained in an interior of at least one of said metal particles, wherein said metal particles melt upon heating so that said curing promoter comes in contact with said mixture to promote a curing reaction between said curing agent and said base resin; and said convection additive is capable of generating a gas upon heating.

INDUSTRIAL APPLICABILITY

When an electronic component (e.g., semiconductor chip) is mounted over a circuit substrate, a metal particles-dispersed composition of the present invention allows the solder material and the like to self-assemble into a region between the opposed electrodes prior to an initiation of the curing reaction. As a result, there is no residual solder material that is left outside of the region between the opposed electrodes, which will lead to an improvement of electrical insulating properties. Therefore, the metal particles-dispersed composition of the present invention is particularly useful for an flip chip mouting field in which an electronic component and a circuit substrate are interconnected.

CROSS REFERENCE TO RELATED PATENT APPLICATION

The present application claims the right of priority of Japanese Patent Application No. 2005-065243 (filed on Mar. 9, 2005, the title of the invention: "METAL PARTICLES-DISPERSED COMPOSITION AND FLIP-CHIP MOUNTING PROCESS AND BUMP-FORMING PROCESS USING THE SAME"), the disclosure of which is incorporated herein by reference.

The invention claimed is:

1. A flip chip mounting process wherein a semiconductor chip and a circuit substrate are electrically interconnected, said process comprising the steps of:

(i) preparing a semiconductor chip on which a first plurality of electrodes are formed and a circuit substrate on which a second plurality of electrodes are formed;

(ii) supplying a composition onto a surface of said circuit substrate, such surface being provided with said second plurality of electrodes, wherein the composition comprises a first component, a second component, metal particles and a convection additive, wherein said metal particles are dispersed in said second component, and said convection additive is contained in said second component, wherein said first component is contained in an interior of at least one of said metal particles, and said metal articles melt upon heating so that said first component comes in contact with said second component to form a thermoset resin, and said convection additive is capable of generating a gas upon heating;

(iii) bringing said semiconductor chip into contact with a surface of said composition such that said first plurality of electrodes of said semiconductor chip are opposed to said second plurality of electrodes of said circuit substrate; and (iv) heating said circuit substrate, and thereby electrical connections comprised of a metal component constituting said metal particles are formed between said first plurality of electrodes and said second plurality of electrodes, and also a thermoset resin layer is formed between said semiconductor chip and said circuit substrate, wherein, during the heating step (iv), a gas is generated due to boiling or decomposition of said convection additive, and then movement of said gas causes a convection within said composition, which leads to promotion of a self-assembly of said metal particles and/or said molten metal component toward said first and second plurality of electrodes.

2. The flip chip mounting process according to claim 1, wherein a plurality of said semiconductor chips are brought into contact with the surface of said composition in the step (iii).

3. The flip chip mounting process according to claim 1, wherein said circuit substrate prepared in the step (i) is a printed circuit board, a ceramic substrate, a glass substrate or a semiconductor wafer.

4. A process for forming bumps on a plurality of electrodes of a circuit substrate, comprising the steps of:
(i) preparing a circuit substrate on which a plurality of electrodes are formed, and also a cover having release properties;
(ii) supplying a composition onto a surface (A) of said circuit substrate, such surface (A) being provided with said electrodes; the composition comprising a first component, a second component, metal particles and a convection additive wherein said metal particles are dispersed in said second component, and said convection additive is contained in said second component; said first component is contained in an interior of at least one of said metal particles, wherein said metal particles melt upon heating so that said first component comes in contact with said second component to form a thermoset resin; and said convection additive is capable of generating a gas upon heating;
(iii) bringing said cover into contact with a surface of said composition;
(iv) heating said circuit substrate, and thereby bumps consisting of a metal component constituting said metal particles are formed on said electrodes, and also a thermoset resin layer is formed between said circuit substrate and said cover; and
(v) removing said cover.

5. The process according to claim 4, wherein,
between the step (i) and step (ii), a release agent layer is formed on said surface (A) of said circuit substrate except for a surface region provided with said electrodes; and
in the step (v), not only said cover is removed, but also said thermoset resin layer and said release agent layer are removed.

6. The process according to claim 4, wherein,
a plurality of lands are formed on a surface (B) of said cover prepared in the step (i) such that a land pattern corresponds to that of said electrodes of said circuit substrate, and also a release agent layer is formed on said surface (B) except for a surface region provided with said lands;
in the step (iii), said cover is brought into contact with the surface of said composition such that said lands of said cover are opposed to said electrodes of said circuit substrate;
in the step (iv), said bumps consisting of said metal component constituting said metal particles are formed so that said lands and said electrodes are interconnected; and
in the step (v), said cover and said release agent layer are removed whereas said lands are left to remain on said bumps.

7. The process according to claim 4, wherein said circuit substrate prepared in the step (i) is a printed circuit board, a ceramic substrate, a glass substrate or a semiconductor wafer.

8. The process according to claim 4, wherein said cover prepared in the step (i) is the following plate:
a plate made of glass;
a plate made of ceramic; or
a plate that is coated with at least one material selected from the group consisting of silicone resin, fluorine resin, polypropylene resin, silicone oil, inorganic oxide, inorganic nitride and inorganic nitrided oxide.

9. The process according to claim 5, wherein said release agent layer is made of at least one material selected from the group consisting of silicone resin, fluorine resin, polypropylene resin, silicone oil, inorganic oxide, inorganic nitride and inorganic nitrided oxide.

10. A semiconductor package obtained by forming bumps onto a semiconductor wafer serving as said circuit substrate by performance of the process according to claim 4, followed by dividing said semiconductor wafer into pieces.

* * * * *

UNITED STATES PATENT AND TRADEMARK OFFICE
CERTIFICATE OF CORRECTION

| | |
|---|---|
| PATENT NO. | : 7,910,403 B2 |
| APPLICATION NO. | : 11/885562 |
| DATED | : March 22, 2011 |
| INVENTOR(S) | : Koichi Hirano et al. |

It is certified that error appears in the above-identified patent and that said Letters Patent is hereby corrected as shown below:

IN THE CLAIMS
In column 22, claim 1, line 16, "articles" should read --particles--.

Signed and Sealed this
Nineteenth Day of July, 2011

David J. Kappos
*Director of the United States Patent and Trademark Office*